(12) United States Patent
Nakamura

(10) Patent No.: US 12,137,538 B2
(45) Date of Patent: Nov. 5, 2024

(54) COOLING SYSTEM AND ELECTRONIC DEVICE

(71) Applicant: NEC Platforms, Ltd., Kawasaki (JP)

(72) Inventor: Yasuhito Nakamura, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 17/768,301

(22) PCT Filed: Oct. 30, 2020

(86) PCT No.: PCT/JP2020/040862
§ 371 (c)(1),
(2) Date: Apr. 12, 2022

(87) PCT Pub. No.: WO2021/095569
PCT Pub. Date: May 20, 2021

(65) Prior Publication Data
US 2024/0107708 A1  Mar. 28, 2024

(30) Foreign Application Priority Data

Nov. 13, 2019 (JP) .................................. 2019-205338

(51) Int. Cl.
*H05K 7/20* (2006.01)
(52) U.S. Cl.
CPC ..... *H05K 7/20281* (2013.01); *H05K 7/20272* (2013.01); *H05K 7/20772* (2013.01)
(58) Field of Classification Search
CPC .......... H05K 7/20272; H05K 7/20772; H05K 7/20281
USPC .................................................. 361/679.53
See application file for complete search history.

(56) References Cited

U.S. PATENT DOCUMENTS

| 5,052,472 A * | 10/1991 | Takahashi ............. F25B 49/025 257/E23.098 |
| 5,422,787 A * | 6/1995 | Gourdine ........... H05K 7/20154 361/695 |
| 7,007,506 B2 * | 3/2006 | Kubo ................. H05K 7/20309 165/170 |

(Continued)

FOREIGN PATENT DOCUMENTS

| JP | H05-160310 A | 6/1993 |
| JP | 2924384 B2 * | 7/1999 |

(Continued)

OTHER PUBLICATIONS

JP-2924384-B2 English translation (Year: 1999).*

(Continued)

*Primary Examiner* — Anatoly Vortman

(57) ABSTRACT

A cooling system includes a first module, a second module provided at a different position in a depth direction of a housing with respect to the first module, a third module provided at a different position in a width direction of the housing with respect to the first module and the second module, an upstream side tube configured to supply a cooling medium to a cooling member of the first module, a downstream side tube configured to supply the cooling medium passed through the cooling member of the first module to a cooling member of the second module, and a branch tube configured to branch from the downstream side tube and supply the cooling medium to a cooling member of the third module.

5 Claims, 12 Drawing Sheets

(56) References Cited

U.S. PATENT DOCUMENTS

| | | | | |
|---|---|---|---|---|
| 7,240,722 | B2* | 7/2007 | Lai | H01L 23/427 |
| | | | | 165/80.4 |
| 7,318,322 | B2* | 1/2008 | Ota | H05K 7/20781 |
| | | | | 62/305 |
| 7,325,591 | B2* | 2/2008 | Duan | H01L 23/473 |
| | | | | 257/E23.098 |
| 7,957,148 | B1* | 6/2011 | Gallarelli | H01L 23/32 |
| | | | | 174/16.3 |
| 8,240,362 | B2* | 8/2012 | Eriksen | H05K 7/20263 |
| | | | | 165/80.4 |
| 8,245,764 | B2* | 8/2012 | Eriksen | H01L 23/473 |
| | | | | 165/80.4 |
| 8,289,701 | B2* | 10/2012 | Suzuki | G06F 1/203 |
| | | | | 361/679.55 |
| 8,305,754 | B2* | 11/2012 | Wu | F28D 15/0275 |
| | | | | 361/689 |
| 8,405,975 | B2* | 3/2013 | Helberg | G06F 1/203 |
| | | | | 361/679.55 |
| 8,760,863 | B2* | 6/2014 | Campbell | H05K 7/20781 |
| | | | | 361/679.01 |
| 9,215,832 | B2* | 12/2015 | Chang | H05K 7/20636 |
| 9,345,169 | B1* | 5/2016 | Campbell | H05K 7/20327 |
| 9,462,728 | B2* | 10/2016 | Demange | H05K 7/20254 |
| 9,468,132 | B2* | 10/2016 | Taguchi | H05K 7/20209 |
| 9,575,521 | B1* | 2/2017 | North | H05K 7/20772 |
| 10,201,115 | B2* | 2/2019 | Johnson | H05K 7/20772 |
| 10,739,084 | B2* | 8/2020 | Tsai | H05K 7/20254 |
| 10,856,446 | B2* | 12/2020 | Boyden | H05K 7/20445 |
| 10,925,187 | B1* | 2/2021 | Coxe, III | H05K 7/20836 |
| 2001/0000880 | A1* | 5/2001 | Chu | F25B 43/00 |
| | | | | 62/509 |
| 2004/0008483 | A1* | 1/2004 | Cheon | G06F 1/20 |
| | | | | 361/699 |
| 2004/0057211 | A1* | 3/2004 | Kondo | G06F 1/20 |
| | | | | 361/696 |
| 2005/0241803 | A1* | 11/2005 | Malone | G06F 1/20 |
| | | | | 165/80.4 |
| 2005/0241806 | A1* | 11/2005 | Liu | H01L 23/427 |
| | | | | 165/104.21 |
| 2006/0002086 | A1 | 1/2006 | Teneketges et al. | |
| 2006/0187638 | A1* | 8/2006 | Vinson | H05K 7/20009 |
| | | | | 361/698 |
| 2008/0163631 | A1 | 7/2008 | Campbell et al. | |
| 2010/0313590 | A1 | 12/2010 | Campbell et al. | |
| 2013/0008628 | A1* | 1/2013 | Tiengtum | G01R 1/0458 |
| | | | | 248/224.7 |
| 2014/0198453 | A1 | 7/2014 | Zhang et al. | |
| 2014/0233175 | A1* | 8/2014 | Demange | H05K 7/20254 |
| | | | | 361/699 |
| 2015/0059388 | A1* | 3/2015 | Hirano | H05K 7/20772 |
| | | | | 62/259.2 |
| 2015/0077937 | A1* | 3/2015 | Daly | G02B 6/4268 |
| | | | | 361/699 |
| 2015/0124406 | A1 | 5/2015 | Taguchi et al. | |
| 2015/0146376 | A1* | 5/2015 | Taguchi | F28F 27/02 |
| | | | | 361/699 |
| 2017/0127575 | A1* | 5/2017 | Lunsman | H05K 7/20263 |
| 2018/0135901 | A1* | 5/2018 | Hirai | H05K 7/20781 |
| 2018/0279510 | A1* | 9/2018 | Johnson | H05K 7/20772 |
| 2018/0340744 | A1* | 11/2018 | Tsai | F28D 15/00 |
| 2019/0246523 | A1* | 8/2019 | Boyden | H05K 7/20772 |

FOREIGN PATENT DOCUMENTS

| | | |
|---|---|---|
| JP | 2004-103886 A | 4/2004 |
| JP | 2005-228216 A | 8/2005 |
| JP | 2007-281279 A | 10/2007 |
| JP | 2008-509542 A | 3/2008 |
| JP | 2012-529759 A | 11/2012 |
| JP | 2014-525724 A | 9/2014 |
| WO | 2010/142505 A1 | 12/2010 |

OTHER PUBLICATIONS

International Search Report for PCT Application No. PCT/JP2020/040862, mailed on Jan. 19, 2021.
Extended European Search Report for EP Application No. 20887317.4, dated on Nov. 8, 2023.

* cited by examiner

COOLING SYSTEM AND ELECTRONIC DEVICE

This application is a National Stage Entry of PCT/JP2020/040862 filed on Oct. 30, 2020, which claims priority from Japanese Patent Application 2019-205338 filed on Nov. 13, 2019, the contents of all of which are incorporated herein by reference, in their entirety.

TECHNICAL FIELD

The present invention relates to a cooling system and an electronic device.

BACKGROUND ART

Various electronic devices house a plurality of electronic components in a housing. A liquid cooling scheme is adopted in which the electronic components having high heat generation among the plurality of electronic components housed in the housing are cooled by a coolant.

For example, Patent Document 1 discloses a configuration including a liquid-cooled cooling structure and a heat transfer element for cooling a heat generating component (heat generating member) of an electronic subsystem (module) docked in a housing. The liquid-cooled cooling structure includes a coolant carrying channel. The heat transfer element is coupled to the heat generating component and physically contacts the liquid-cooled cooling structure. In addition, Patent Document 1 discloses a configuration in which the coolant carrying channel of the liquid-cooled cooling structure is provided in each of electronic subsystems docked in a plurality of housings fixed to an electronic device rack.

PRIOR ART DOCUMENT

Patent Document

Patent Document 1: Published Japanese Translation No. 2012-529759 of the PCT International Publication

SUMMARY

Problems to be Solved by the Invention

In the configuration disclosed in Patent Document 1, tubes forming coolant carrying channels are provided in accordance with the number of housings (electronic subsystems) fixed to the electronic device rack. As the number of coolant carrying channels increases, the number of tubes for transporting the cooling medium increases, and material cost and labor for assembling are required. In particular, when a plurality of electronic subsystems are provided in one housing, the number of tubes forming the coolant carrying channels is the number in accordance with the electronic subsystems provided in the housing. As a result, the material cost and the labor for assembling are further increased, and it may be difficult to secure the space for providing a great number of tubes.

An example object of the present invention is to provide a cooling system and an electronic device that solve any of the above-described problems.

Means for Solving the Problems

A cooling system according to a first example aspect of the present invention is provided with a first module provided in a housing and including a first heat generating member and a cooling member configured to cool the first heat generating member, a second module provided in the housing at a different position in a depth direction of the housing with respect to the first module and including a second heat generating member and a cooling member configured to cool the second heat generating member, a third module provided in the housing at a different position in a width direction intersecting the depth direction of the housing with respect to the first module and the second module and including a third heat generating member and a cooling member configured to cool the third heat generating member, an upstream side tube configured to supply a cooling medium to the cooling member of the first module, a downstream side tube configured to supply the cooling medium passed through the cooling member of the first module to the cooling member of the second module, and a branch tube configured to branch from the downstream side tube between the first module and the second module and supply the cooling medium to the cooling member of the third module.

A cooling system according to a second example aspect of the present invention is provided with a first module provided in a housing and including a first heat generating member and a cooling member configured to cool the first heat generating member, a second module provided in the housing at a different position in a depth direction of the housing with respect to the first module and including a second heat generating member and a cooling member configured to cool the second heat generating member, a third module provided in the housing at a different position in a width direction intersecting the depth direction of the housing with respect to the first module and the second module and including a third heat generating member and a cooling member configured to cool the third heat generating member, a header provided in the housing and to which a cooling medium supplied from an outside is sent, a first upstream side tube connected to the header and configured to supply the cooling medium from the header to the cooling member of the first module, a first downstream side tube configured to supply the cooling medium passed through the cooling member of the first module to the cooling member of the second module, and a second upstream side tube connected to the header and configured to supply the cooling medium from the header to the cooling member of the third module.

An electronic device according to a third example aspect of the present invention is provided with the housing and the cooling system.

Example Advantageous Effects of Invention

According to the first example aspect to the third example aspect described above, the number of tubes can be reduced.

EXAMPLE EMBODIMENT

A plurality of example embodiments of the present invention will be described below with reference to the drawings.

First Example Embodiment

Figure 1:
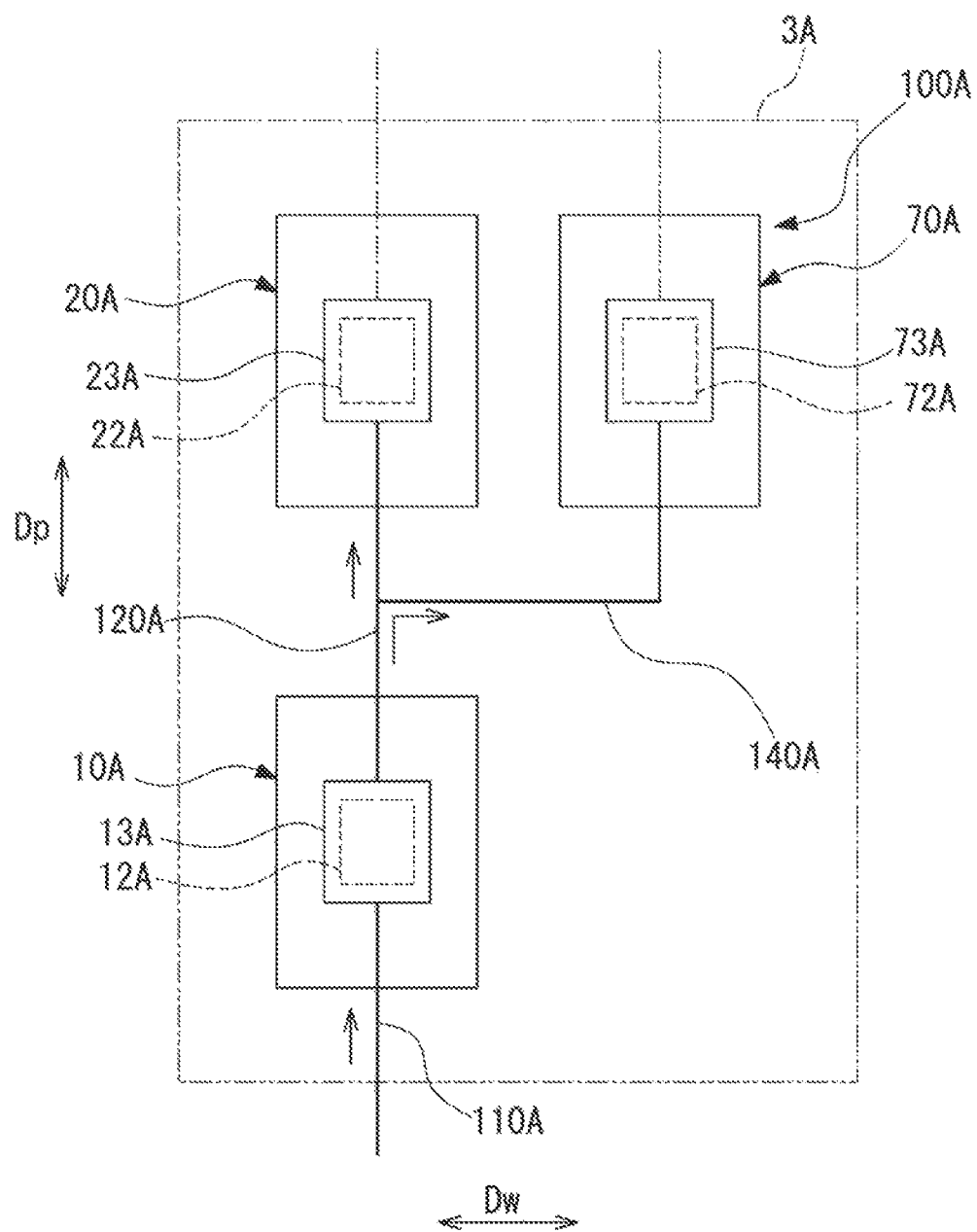
FIG. 1 is a diagram showing a minimum configuration of a cooling system according to a first example embodiment of the present invention.

FIG. 1 is a diagram showing a minimum configuration of a cooling system according to the present example embodiment.

As shown in this figure, a cooling system 100A needs only to be provided with at least a first module 10A, a second module 20A, a third module 70A, an upstream side tube 110A, a downstream side tube 120A, and a branch tube 140A.

The first module 10A is provided in a housing 3A. The first module 10A is provided with a heat generating member 12A (first heat generating member) and a cooling member 13A for cooling the heat generating member 12A.

The second module 20A is provided in the housing 3A at a different position in the depth direction Dp of the housing 3A with respect to the first module 10A. The second module 20A is provided with a heat generating member 22A (second heat generating member) and a cooling member 23A for cooling the heat generating member 22A.

The third module 70A is provided in the housing 3A at a different position in the width direction Dw intersecting the depth direction Dp of the housing 3A with respect to the first module 10A and the second module 20A. The third module 70A is provided with a heat generating member 72A (third heat generating member) and a cooling member 73A for cooling the heat generating member 72A.

The upstream side tube 110A supplies a cooling medium to the cooling member 13A of the first module 10A.

The downstream side tube 120A supplies the cooling medium passed through the cooling member 13A of the first module 10A to the cooling member 23A of the second module 20A.

The branch tube 140A branches from the downstream side tube 120A between the first module 10A and the second module 20A. The branch tube 140A supplies the cooling medium to the cooling member 73A of the third module 70A.

In the cooling system 100A, the cooling medium cools the cooling member 13A of the first module 10A via the upstream side tube 110A and then cools the cooling member 23A of the second module 20A via the downstream side tube 120A.

Therefore, the heat generating member 12A of the first module 10A is cooled by the cooling member 13A. In addition, the heat generating member 22A of the second module 20A is cooled by the cooling member 23A.

In addition, the cooling medium is supplied to the cooling member 73A of the third module 70A through the branch tube 140A branched from the downstream side tube 120A between the first module 10A and the second module 20A. As a result, the cooling member 73A of the third module 70A is cooled.

Therefore, the heat generating member 72A of the third module 70A is cooled by the cooling member 73A.

In such a configuration, the cooling system 100A can supply the cooling medium to the first module 10A, the second module 20A, and the third module 70A in the housing 3A through the upstream side tube 110A. Therefore, the number of tubes for transporting the cooling medium from the outside to the inside of the housing 3A can be reduced, the cost and the labor for assembling can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

Second Example Embodiment

Figure 2:
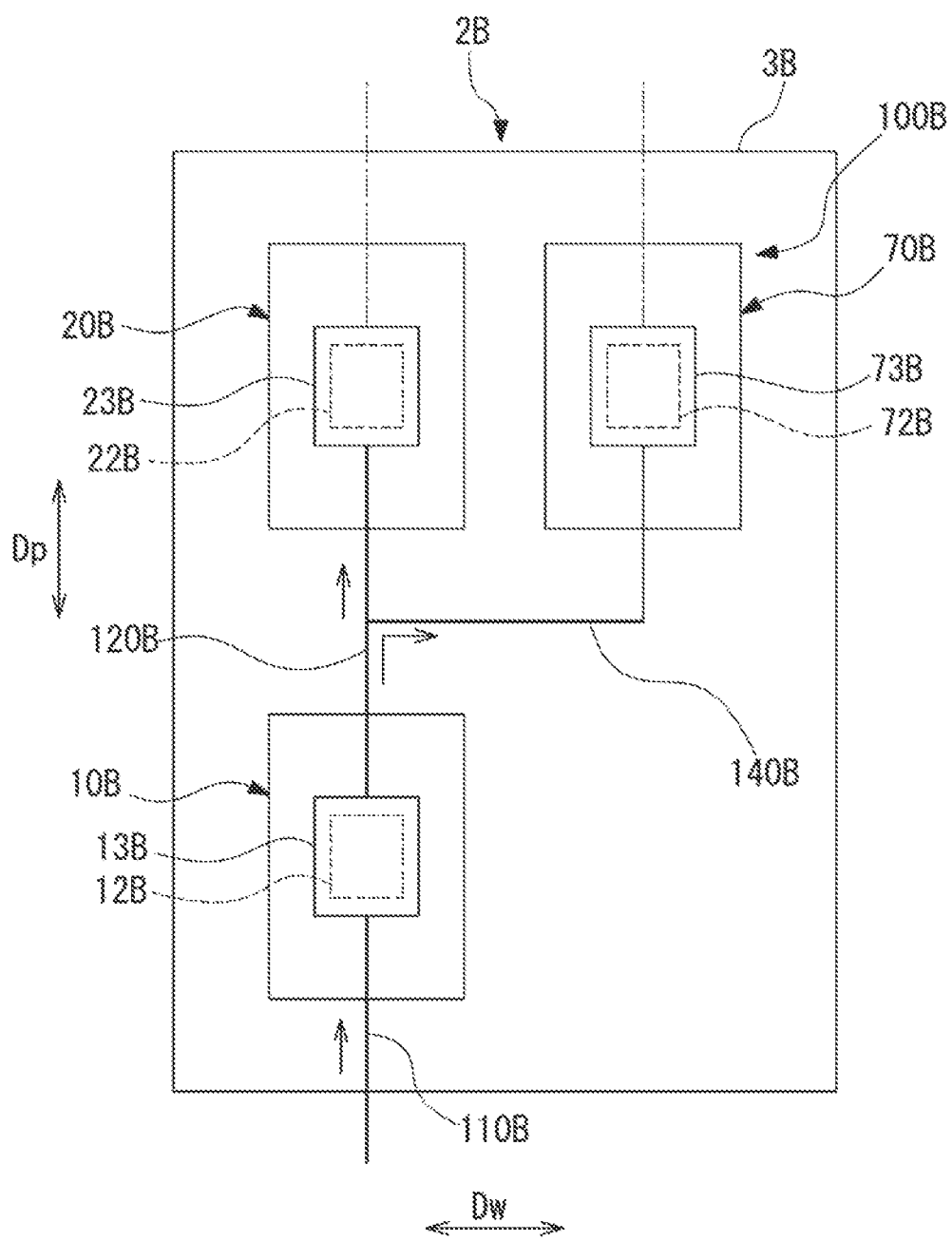
FIG. 2 is a diagram showing a minimum configuration of an electronic device according to a second example embodiment of the present invention.

FIG. 2 is a diagram showing a minimum configuration of an electronic device according to the present example embodiment.

As shown in this figure, an electronic device 2B needs only to be provided with at least a housing 3B and a cooling system 100B. The cooling system 100B is provided with a first module 10B, a second module 20B, a third module 70B, an upstream side tube 110B, a downstream side tube 120B, and a branch tube 140B.

The first module 10B is provided in the housing 3B. The first module 10B is provided with a heat generating member 12B (first heat generating member) and a cooling member 13B for cooling the heat generating member 12B.

The second module 20B is provided in the housing 3B at a position different in the depth direction Dp of the housing 3B with respect to the first module 10B. The second module 20B is provided with a heat generating member 22B (second heat generating member) and a cooling member 23B for cooling the heat generating member 22B.

The third module 70B is provided in the housing 3B at a different position in the width direction Dw intersecting the depth direction Dp of the housing 3B with respect to the first module 10B and the second module 20B. The third module 70B is provided with a heat generating member 72B (third heat generating member) and a cooling member 73B for cooling the heat generating member 72B.

The upstream side tube 110B supplies a cooling medium to the cooling member 13B of the first module 10B.

The downstream side tube 120B supplies the cooling medium passed through the cooling member 13B of the first module 10B to the cooling member 23B of the second module 20B.

The branch tube 140B branches from the downstream side tube 120B between the first module 10B and the second module 20B. The branch tube 140B supplies the cooling medium to the cooling member 73B of the third module 70B.

In the electronic device 2B, the cooling medium cools the cooling member 13B of the first module 10B via the upstream side tube 110B and then cools the cooling member 23B of the second module 20B via the downstream side tube 120B.

Therefore, the heat generating member 12B of the first module 10B is cooled by the cooling member 13B. The heat generating member 22B of the second module 20B is cooled by the cooling member 23B.

In addition, the cooling medium is supplied to the cooling member 73B of the third module 70B through the branch tube 140B branched from the downstream side tube 120B between the first module 10B and the second module 20B. As a result, the cooling member 73B of the third module 70B is cooled.

Therefore, the heat generating member 72B of the third module 70B is cooled by the cooling member 73B.

In such a configuration, the electronic device 2B can supply the cooling medium to the first module 10B, the second module 20B, and the third module 70B in the housing 3B through the upstream side tube 110B. Therefore, the number of tubes for transporting the cooling medium from the outside to the inside of the housing 3B can be reduced, the cost and the labor for assembling can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

Third Example Embodiment

Figure 3:
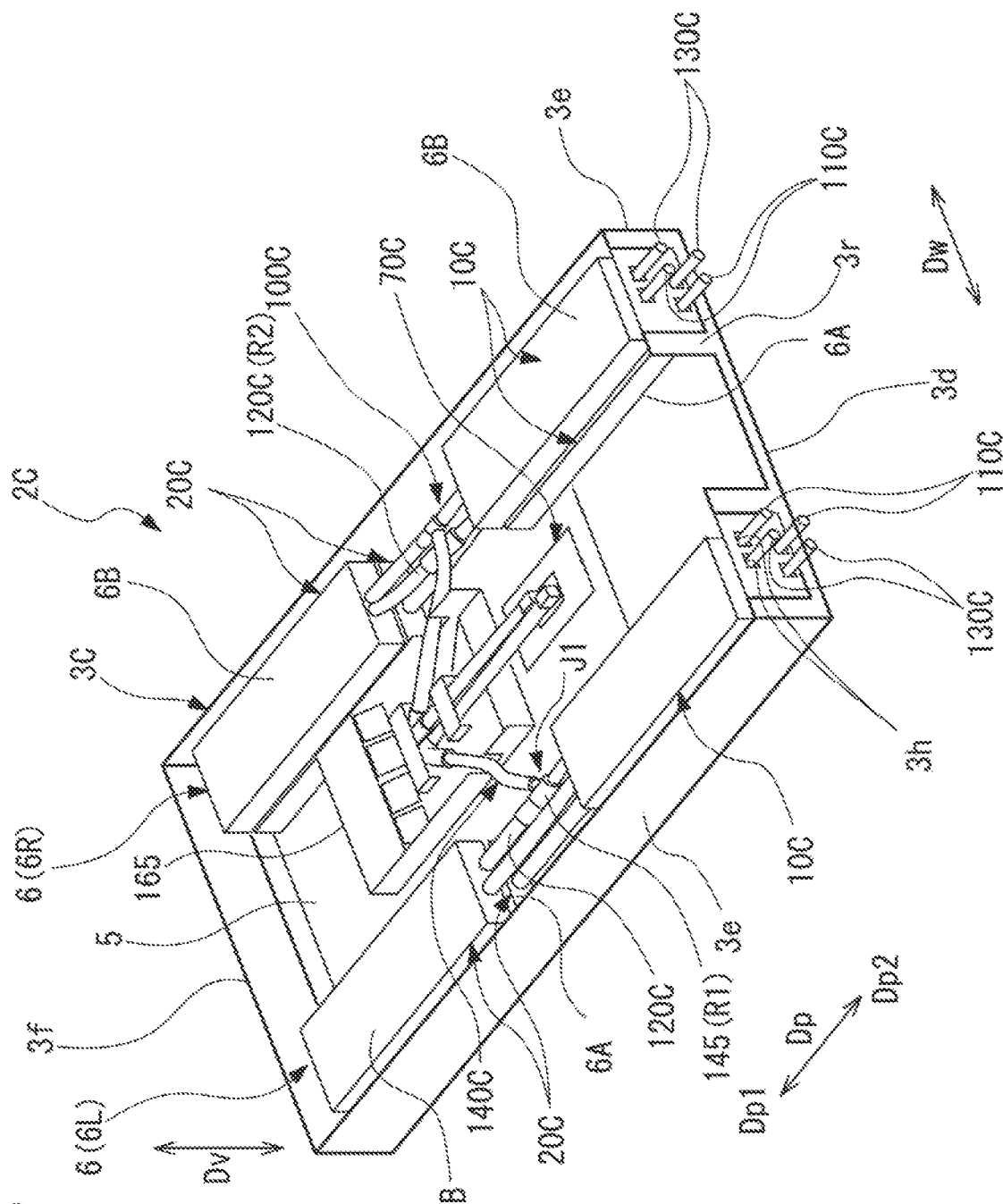
FIG. 3 is a perspective view showing a schematic configuration of an electronic device according to a third example embodiment of the present invention.

FIG. 3 is a perspective view showing a schematic configuration of an electronic device according to the present example embodiment.
(Overall Configuration of Server)

As shown in this figure, a server (electronic device) 2C is provided with a housing 3C, a main substrate 5, side modules 6, and a third module 70C. One or more servers 2C are housed in a server rack (not shown) to form a server apparatus (not shown). The server 2C is provided so as to be able to be inserted and removed from the server rack (not shown) along the horizontal direction. In the following description, the insertion and removal direction of the server 2C with respect to the server rack is referred to as a depth direction Dp. In addition, the direction orthogonal to the depth direction Dp in the horizontal plane is referred to as a width direction Dw, and the direction orthogonal to the depth direction Dp and the width direction Dw is referred to as a vertical direction Dv.
(Housing)

The housing 3C is formed in a rectangular shape having a long side in the depth direction Dp when viewed from the vertical direction Dv in a plan view. The housing 3C is provided with at least a bottom plate 3d provided along a horizontal plane and a pair of side plates 3e rising upward from both sides of the bottom plate 3d in the width direction Dw. The housing 3C is provided with a rear panel 3r rising upward from the bottom plate 3d on the second side Dp2 of the bottom plate 3d in the depth direction Dp. Furthermore, the housing 3C may be provided with a front panel 3f on the first side Dp1 of the bottom plate 3d in the depth direction Dp.
(Main Substrate)

The main substrate 5, the side modules 6, and the third module 70C are housed in the housing 3C.

The main substrate 5 has a flat plate shape and is disposed along the bottom plate 3d of the housing 3C. The main substrate 5 is disposed at a central portion in the housing 3C in the width direction Dw.
(Side Module)

The side modules 6 are disposed on both sides of the main substrate 5 in the width direction Dw in the housing 3C. In each side module 6, a lower stage side module portion 6A and an upper stage side module portion 6B are provided so as to be laminated in the vertical direction Dv. Each of the lower stage side module portion 6A and the upper stage side module portion 6B is provided with a first module 10C and a second module 20C. That is, the server 2C is provided with a plurality of sets (in the present example embodiment, a total of four sets) of the first module 10C and the second module 20C.

Figure 4:
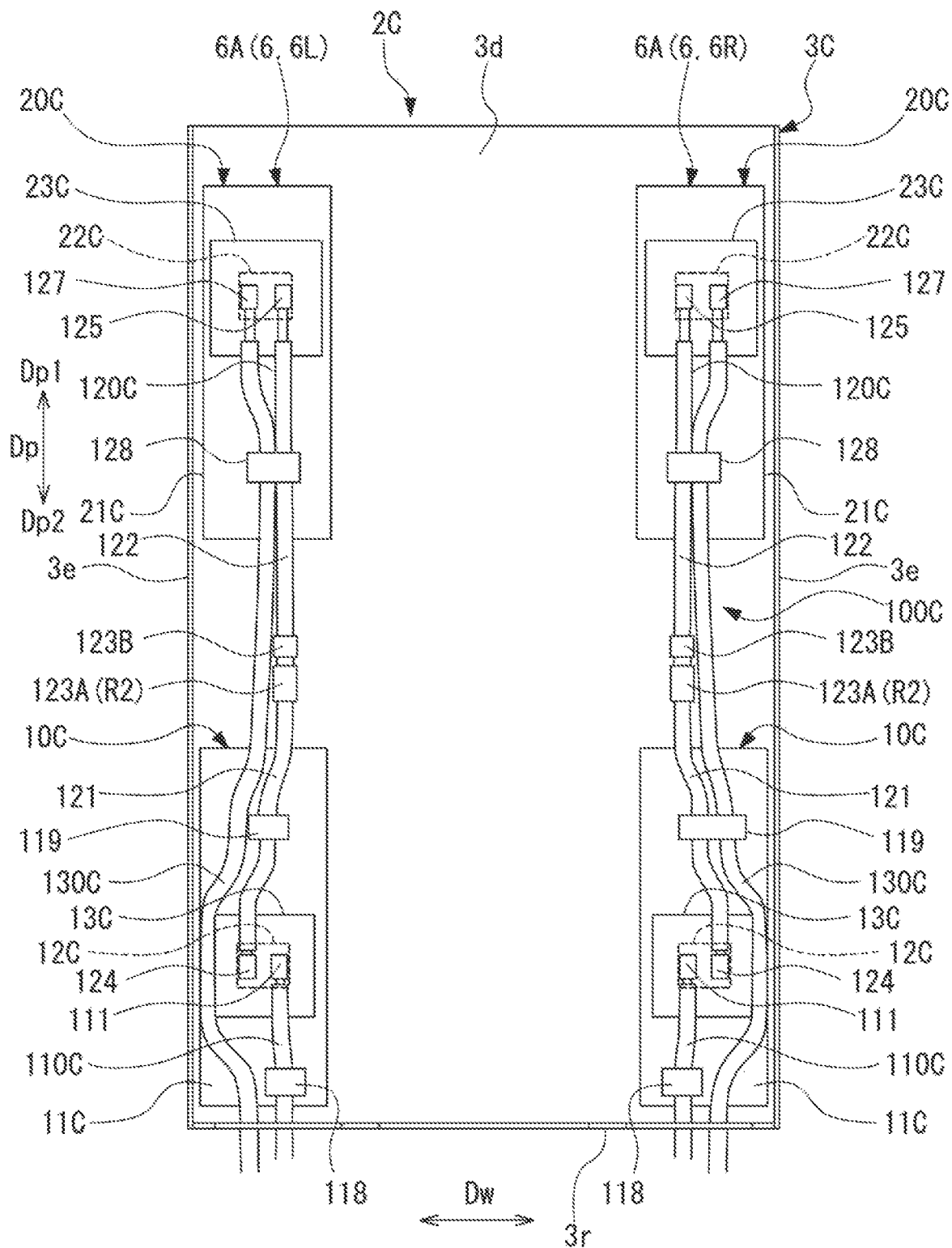
FIG. 4 is a plan view showing side modules on a lower stage side in the electronic device according to the third example embodiment of the present invention.
Figure 5:
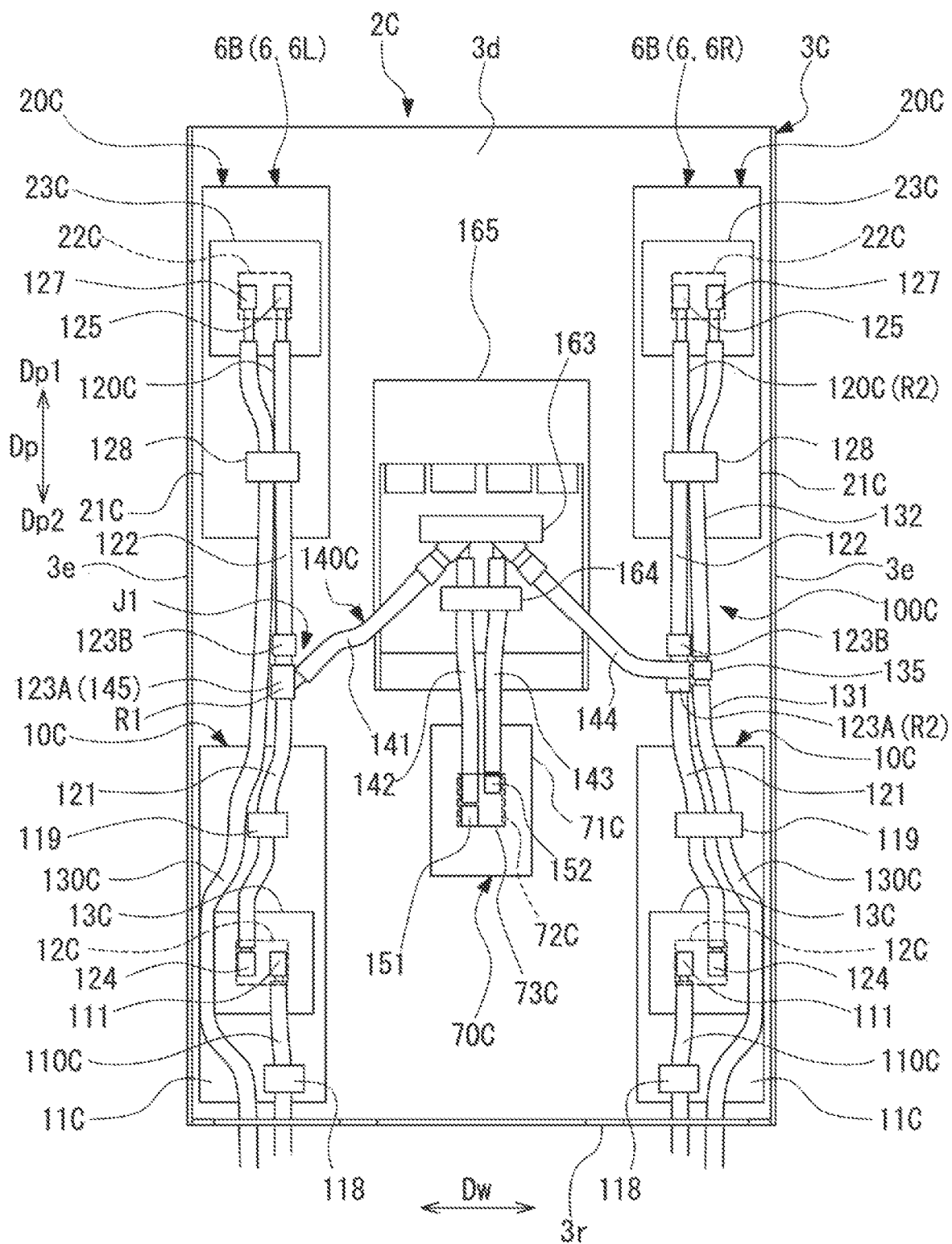
FIG. 5 is a plan view showing side modules on an upper stage side and a third module in the electronic device according to the third example embodiment of the present invention.

FIG. 4 is a plan view showing side modules on a lower stage side in the electronic device according to the present example embodiment. FIG. 5 is a plan view showing side modules on an upper stage side and a third module in the electronic device according to the present example embodiment.

As shown in these figures, the first module 10C is provided in the housing 3C in each of the lower stage side module portion 6A and the upper stage side module portion 6B. The first module 10C is provided with a substrate 11C, a central processing unit (CPU, first heat generating member) 12C, and a cooling member 13C.

The substrate 11C has a flat plate shape and is disposed along a horizontal plane. The CPU 12C is mounted on the surface of the substrate 11C. The CPU 12C functions as a processor that executes predetermined processing. The cooling member 13C is provided so as to be laminated on the CPU 12C. The cooling member 13C is made of a metal material and has, for example, a rectangular parallelepiped shape. A space (not shown) into which the cooling medium flows is formed inside the cooling member 13C. A refrigerant inlet (not shown) and a refrigerant outlet (not shown) communicating with the space (not shown) are formed on the upper surface of the cooling member 13C.

The second module 20C is provided in the housing 3C at a different position in the depth direction Dp of the housing 3C with respect to the first module 10C. The second module 20C is provided at an interval from the first module 10C on the first side Dp1 of the housing 3C in the depth direction Dp. The second module 20C has the same configuration as that of the first module 10C, and is provided with a substrate 21C, a CPU (second heat generating member) 22C, and a cooling member 23C.

The substrate 21C has a flat plate shape and is disposed along a horizontal plane. The CPU 22C is mounted on the surface of the substrate 21C. The CPU 22C functions as a processor that executes predetermined processing. The cooling member 23C is provided so as to be laminated on the CPU 22C. The cooling member 23C is made of a metal material and has, for example, a rectangular parallelepiped shape. A space (not shown) into which the cooling medium flows is formed inside the cooling member 23C. A refrigerant inlet (not shown) and a refrigerant outlet (not shown) communicating with the space (not shown) are formed on the upper surface of the cooling member 23C.

(Third Module)

As shown in FIG. 3, the third module 70C is provided in the housing 3C at a different position in the width direction Dw with respect to the first module 10C and the second module 20C. The third module 70C is disposed above the main substrate 5 at an interval with each side module 6 in the width direction Dw. The third module 70C is disposed at substantially the same height as the upper stage side module portions 6B in the vertical direction Dv. As shown in FIG. 5, the third module 70C is provided with a substrate 71C, a CPU (third heat generating member) 72C, and a cooling member 73C.

The substrate 71C has a flat plate shape and is disposed along a horizontal plane in parallel with the bottom plate 3d of the housing 3C. The substrate 71C is supported on the main substrate 5 or the bottom plate 3d via a support member (not shown).

The CPU 72C is mounted on the surface of the substrate 71C. The CPU 72C functions as a processor that executes predetermined processing in cooperation with the CPUs 12C and 22C of the plurality of first modules 10C and second modules 20C.

The cooling member 73C is provided so as to be laminated on the CPU 72C. The cooling member 73C is made of a metal material and has, for example, a rectangular parallelepiped shape. A space (not shown) into which the cooling medium flows is formed inside the cooling member 73C. A refrigerant inlet (not shown) and a refrigerant outlet (not shown) communicating with the space (not shown) are formed on the upper surface of the cooling member 73C.

(Cooling System)

As shown in FIGS. 3 to 5, the server 2C is provided with a cooling system 100C. The cooling system 100C cools the cooling members 13C of the first modules 10C, the cooling members 23C of the second modules 20C, and the cooling member 73C of the third module 70C with a cooling medium made of a liquid such as water. The cooling system 100C is provided with the first modules 10C, the second modules 20C, the upstream side tubes 110C, the downstream side tubes 120C, the discharge tubes 130C, and a branch tube 140C (refer to FIG. 5).

(Upstream Side Tube and Downstream Side Tube)

The upstream side tube 110C supplies a cooling medium to the cooling member 13C of the first module 10C from the outside. The upstream side tube 110C is inserted from the outside to the inside of the housing 3C through a tube insertion opening 3h (refer to FIG. 3) formed in the rear panel 3r of the housing 3C. As shown in FIGS. 4 and 5, the upstream side tube 110C extends in the depth direction Dp in the housing 3C. The upstream side tube 110C is connected to the cooling member 13C of the first module 10C from the second side Dp2 in the depth direction Dp. An end portion of the upstream side tube 110C is connected to the refrigerant inlet (not shown) of the cooling member 13C of the first module 10C via an L-shaped connection joint 111. The upstream side tube 110C is fixed to the substrate 11C of the first module 10C by a holder member 118 between the connection joint 111 and the portion inserted into the tube insertion opening 3h.

The downstream side tube 120C supplies the cooling medium passed through the cooling member 13C of the first module 10C to the cooling member 23C of the second module 20C. The downstream side tube 120C is provided so as to extend in the depth direction Dp between the cooling member 13C of the first module 10C and the cooling member 23C of the second module 20C. One end of the downstream side tube 120C is connected to the cooling member 13C of the first module 10C, and the other end of the downstream side tube 120C is connected to the cooling member 23C of the second module 20C. The downstream side tube 120C is provided with a first downstream side tube 121, a second downstream side tube 122, and joints 123A and 123B.

One end portion of the first downstream side tube 121 is connected to a refrigerant outlet (not shown) of the cooling member 13C of the first module 10C via an L-shaped connection joint 124. The connection joint 124 is connected to the cooling member 13C at a position spaced apart from the connection joint 111 of the upstream side tube 110C in the width direction Dw. The joint 123A is provided at the other end portion of the first downstream side tube 121. The first downstream side tube 121 is fixed to the substrate 11C of the first module 10C by a holder member 119 between the connection joint 124 and the joint 123A.

One end portion of the second downstream side tube 122 is connected to the refrigerant inlet (not shown) of the cooling member 23C of the second module 20C via an L-shaped connection joint 125. The joint 123B is provided at the other end portion of the second downstream side tube 122. The second downstream side tube 122 is fixed to the substrate 21C of the second module 20C by a holder member 128 between the connection joint 125 and the joint 123B.

The joints 123A and 123B are detachably connected to each other. As a result, the joints 123A and 123B detachably connect the first downstream side tube 121 and the second downstream side tube 122.

(Discharge Tube)

The discharge tube 130C discharges the cooling medium passed through the first module 10C and the second module 20C. The discharge tube 130C is inserted into the housing 3C from the outside of the housing 3C through the tube insertion opening 3h formed in the rear panel 3r of the housing 3C. The discharge tube 130C extends in the depth direction Dp in the housing 3C. The discharge tube 130C is connected to the cooling member 23C of the second module 20C from the second side Dp2 in the depth direction Dp. The end portion of the discharge tube 130C is connected to the refrigerant outlet (not shown) of the cooling member 23C of the second module 20C via an L-shaped connection joint 127. The connection joint 127 is connected to the cooling member 23C at a position spaced apart from the connection joint 125 of the second downstream side tube 122 in the width direction Dw. The discharge tube 130C is fixed to the substrate 21C of the second module 20C together with the second downstream side tube 122 by the holder member 128 on the first module 10C side with respect to the connection joint 127.

The discharge tube 130C extends along the upstream side tube 110C and the downstream side tube 120C. When viewed from the second module 20C side, the discharge tube 130C extends from the second module 20C side to the first module 10C side in the depth direction Dp of the housing 3C. The discharge tube 130C extends to the second side Dp2 in the depth direction Dp along the upstream side tube 110C via the first module 10C. The discharge tube 130C is disposed on the side of the cooling member 13C in the width direction Dw when viewed from the vertical direction Dv orthogonal to the surface of the substrate 11C of the first module 10C. The discharge tube 130C is disposed along the side plate 3e of the housing 3C so as to bypass the cooling member 13C (and CPU 12C) of the first module 10C.

(Branch Tube)

Figure 6:
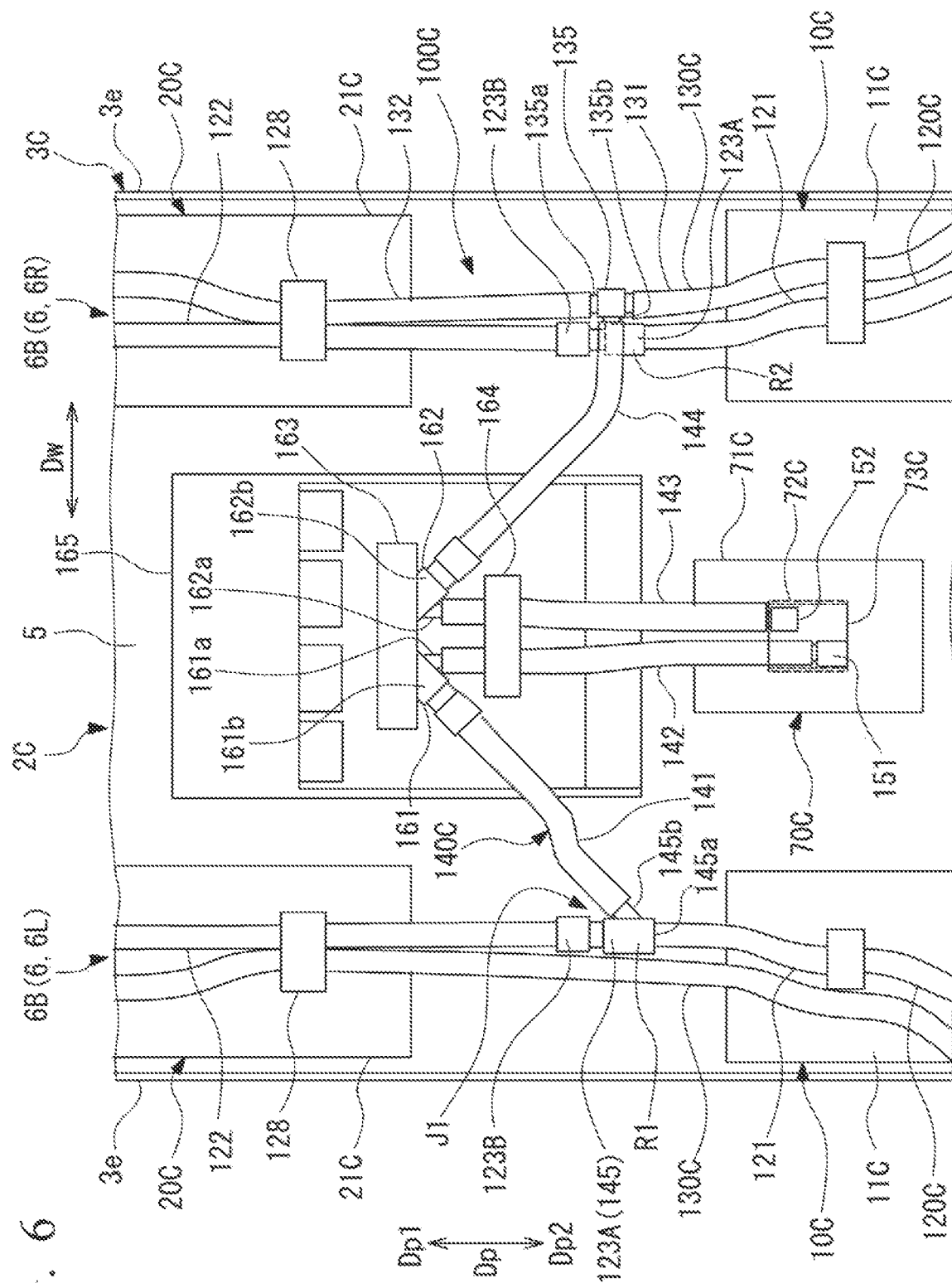
FIG. 6 is a plan view mainly showing a branch tube provided in the side modules on the upper stage side and the third module in the electronic device according to the third example embodiment of the present invention.

FIG. 6 is a plan view mainly showing a branch tube provided in the side modules on the upper stage side and the third module in the electronic device according to the present example embodiment. The branch tube 140C takes out part of the cooling medium from the upper stage side module portion 6B of the side module 6L on one side in the width direction Dw (e.g., left side in FIGS. 5 and 6) in the housing 3C and supplies the part of the cooling medium that has been taken-out to the cooling member 73C of the third module 70C. The branch tube 140C sends the cooling medium passed through the cooling member 73C to the upper stage side module portion 6B of the side module 6R on the other side in the width direction Dw (e.g., right side in FIGS. 5 and 6) in the housing 3C. The branch tube 140C branches from the downstream side tube 120C between the first module 10C and the second module 20C of the upper stage side module portion 6B of the side module 6L. In this manner, the branch tube 140C branches from the downstream side tube 120C of one set among the plurality of sets of the first module 10C and the second module 20C. The branch tube 140C is provided with an upstream side outer branch tube 141, an upstream side inner branch tube 142, a downstream side inner branch tube 143, and a downstream side outer branch tube 144.

The upstream side outer branch tube 141 is provided so as to branch from the downstream side tube 120C. Therefore, in a branch portion J1 where the upstream side outer branch tube 141 of the branch tube 140C branches from the downstream side tube 120C, a branch joint 145 is used for the joint 123A on the first downstream side tube 121 side.

(Branch Joint)

As shown in FIG. 6, the branch joint 145 includes a main tube portion 145a and a branch tube portion 145b. The main tube portion 145a has a tubular shape continuous in the depth direction Dp, and is detachably connected to the joint 123B. The branch tube portion 145b branches from the main tube portion 145a and diagonally extends inward in the width direction Dw of the housing 3C toward the first side Dp1 in the depth direction Dp. One end portion of the upstream side outer branch tube 141 is connected to the branch tube portion 145b. The upstream side outer branch tube 141 extends diagonally from the branch joint 145 to the first side Dp1 in the depth direction Dp inward in the width direction Dw of the housing 3C.

One end of the upstream side inner branch tube 142 is connected to the refrigerant inlet (not shown) of the cooling member 73C of the third module 70C via an L-shaped connection joint 151. The upstream side inner branch tube 142 extends from the connection joint 151 to the first side Dp1 in the depth direction Dp.

The upstream side outer branch tube 141 and the upstream side inner branch tube 142 are connected to each other via a joint member 161. The joint member 161 integrally includes a first connection portion 161a and a second connection portion 161b.

The first connection portion 161a has a tubular shape and extends in the tube axial direction (depth direction Dp) of the upstream side inner branch tube 142. The other end of the upstream side inner branch tube 142 is connected to the first connection portion 161a. The second connection portion 161b has a tubular shape and extends in the tube axial direction (diagonal direction intersecting the width direction Dw and the depth direction Dp) of the upstream side outer branch tube 141. The other end portion of the upstream side outer branch tube 141 is connected to the second connection portion 161b. The first connection portion 161a and the second connection portion 161b communicate with each other.

One end of the downstream side inner branch tube 143 is connected to a refrigerant outlet (not shown) of the cooling member 73C of the third module 70C via an L-shaped connection joint 152. The connection joint 152 is connected to the cooling member 73C at a position spaced apart from the connection joint 151 of the upstream side inner branch tube 142 in the width direction Dw. In addition, the connection joint 152 is connected to the cooling member 73C at a different position with respect to the connection joint 151 of the upstream side inner branch tube 142 in the depth direction Dp. The downstream side inner branch tube 143 extends from the connection joint 152 to the first side Dp1 in the depth direction Dp.

The downstream side outer branch tube 144 is connected to the other end of the downstream side inner branch tube 143 via a joint member 162. The downstream side outer branch tube 144 extends diagonally from the joint member 162 to the second side Dp2 in the depth direction Dp toward the outside of the housing 3C in the width direction Dw.

The joint member 162 integrally includes a first connection portion 162a and a second connection portion 162b. The first connection portion 162a has a tubular shape and extends in the tube axial direction (depth direction Dp) of the downstream side inner branch tube 143. The other end of the downstream side inner branch tube 143 is connected to the first connection portion 162a. The second connection portion 162b has a tubular shape and extends in the tube axial direction (diagonal direction intersecting the width direction Dw and the depth direction Dp) of the downstream side outer branch tube 144. One end portion of the downstream side outer branch tube 144 is connected to the second connection portion 162b. The first connection portion 162a and the second connection portion 162b communicate with each other. Such a joint member 162 has the same configuration as the joint member 161 and is configured to include common components.

The other end of the downstream side outer branch tube 144 is connected to the discharge tube 130C provided in the upper stage side module portion 6B of the side module 6R on the other side in the width direction Dw via a merging joint 135. The discharge tube 130C provided in the upper stage side module portion 6B of the side module 6R is provided with a first discharge tube 131 on the first module 10C side and a second discharge tube 132 on the second module 20C side. The merging joint 135 is provided between an end portion of the first discharge tube 131 and an end portion of the second discharge tube 132.

The merging joint 135 includes a main tube portion 135a and a branch tube portion 135b. The main tube portion 135a has a tubular shape continuous in the depth direction Dp, and both end portions thereof are connected to the first discharge tube 131 and the second discharge tube 132. The branch tube portion 135b branches from the main tube portion 135a at the intermediate portion of the main tube portion 135a and extends inward in the width direction Dw of the housing 3C. The other end of the downstream side outer branch tube 144 is connected to the branch tube portion 135b.

The above joint member 161 and the joint member 162 are fixed to a joint holder 163. In addition, the upstream side inner branch tube 142 and the downstream side inner branch tube 143 are fixed to a branch tube holder 164 between the connection joints 151 and 152 and the joint members 161 and 162. The joint holder 163 and the branch tube holder 164 are provided on a hood member 165. The hood member 165 is fixed to the main substrate 5.

(Flow of Cooling Medium)

In such a cooling system 100C, the cooling medium flows in each of the lower stage side module portions 6A and the upper stage side module portions 6B of the side modules 6 (6L, 6R) on both sides in the width direction Dw as follows.

The cooling medium flows into the upstream side tube 110C from a cooling medium supply tube (not shown) provided outside the housing 3C. The cooling medium flows into the space (not shown) from the refrigerant inlet (not shown) of the cooling member 13C of the first module 10C through the upstream side tube 110C to cool the cooling member 13C. As a result, the heat of the CPU 12C on which the cooling member 13C is laminated is taken away, and the temperature rise of the CPU 12C is suppressed. The cooling medium that flows out from the space (not shown) of the cooling member 13C through the refrigerant outlet (not shown) flows into the space (not shown) from the refrigerant inlet (not shown) of the cooling member 23C of the second module 20C via the downstream side tube 120C to cool the cooling member 23C. As a result, the heat of the CPU 22C of the second module 20C on which the cooling member 23C is laminated is taken away, and the temperature rise of the CPU 22C is suppressed. In this manner, the cooling medium passed through the first module 10C and the second module 20C flows from the space (not shown) of the cooling member 23C through the refrigerant outlet (not shown) into the discharge tube 130C. The cooling medium is discharged to a cooling medium discharge tube (not shown) provided outside the housing 3C through the discharge tube 130C.

In addition, in the upper stage side module portion 6B of the side module 6L on one side in the width direction Dw, part of the cooling medium flowed into the first downstream side tube 121 of the downstream side tube 120C via the cooling member 13C of the first module 10C is diverted to the branch tube 140C through the branch joint 145. In the branch joint 145, the cooling medium flowing through the first downstream side tube 121 is divided to the main tube portion 145a and the branch tube portion 145b. The cooling medium flowed into the branch tube portion 145b flows into the space (not shown) from the refrigerant inlet (not shown) of the cooling member 73C of the third module 70C through the upstream side outer branch tube 141, the joint member 161, and the upstream side inner branch tube 142 to cool the cooling member 73C. As a result, the heat of the CPU 72C on which the cooling member 73C is laminated is taken away, and the temperature rise of the CPU 72C is suppressed. The cooling medium flowing out from the space (not shown) of the cooling member 73C through the refrigerant outlet (not shown) flows into the branch tube portion 135b of the merging joint 135 through the downstream side inner branch tube 143, the joint member 162, and the downstream side outer branch tube 144. The cooling medium merges the flow of the cooling medium in the main tube portion 135a from the branch tube portion 135b and flows into the first discharge tube 131 of the discharge tube 130C. The cooling medium is discharged to a cooling medium discharge tube (not shown) provided outside the housing 3C through the discharge tube 130C provided in the upper stage side module portion 6B of the side module 6R on the other side in the width direction Dw.

(Flow Rate Regulation Portion)

Figure 7:
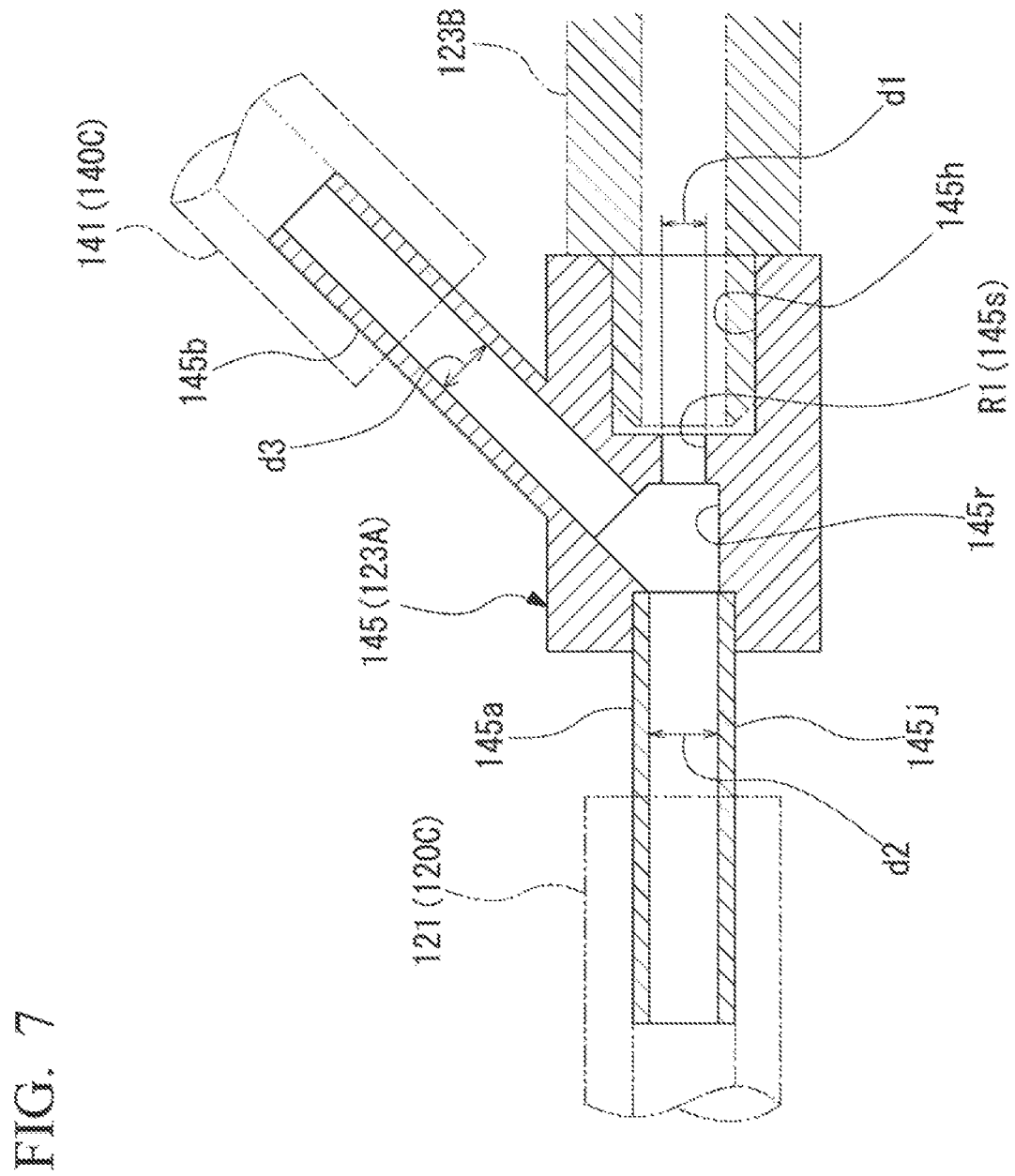
FIG. 7 is a cross-sectional view of a branch joint provided in a cooling system for the electronic device according to the third example embodiment of the present invention.

FIG. 7 is a cross-sectional view of a branch joint provided in the cooling system of the electronic device of the present example embodiment.

As shown in this figure, the branch joint 145 is provided with a first flow rate regulation portion R1. The first flow rate regulation portion R1 regulates the flow rate of the cooling medium in the downstream side tube 120C and the branch tube 140C. The first flow rate regulation portion R1 is a first throttle portion 145s formed in a flow path 145r in the main tube portion 145a of the branch joint 145. The first throttle portion 145s is formed at a bottom portion of an insertion hole portion 145h into which the joint 123B is to be inserted in the main tube portion 145a.

For example, the inner diameter d1 of the first throttle portion 145s may be smaller than the inner diameter d2 of a first connection portion 145j of the main tube portion 145a. Furthermore, the inner diameter d1 of the first throttle portion 145s may be smaller than the inner diameter d3 of the branch tube portion 145b.

The other end portion of the first downstream side tube 121 is connected to the first connection portion 145j of the main tube portion 145a. The upstream side outer branch tube 141 of the branch tube 140C is connected to the branch tube portion 145b.

A second flow rate regulation portion R2 may be provided in the downstream side tube 120C of a set different from a set in which the branch tube 140C branches from the downstream side tube 120C.

For example, the second flow rate regulation portion R2 may be provided in the downstream side tube 120C of a set different from a set provided with the branch portion J1. Here, in the present example embodiment, the set in which the branch portion J1 is provided is the upper stage side module portion 6B of the side module 6L on one side in the width direction Dw in the housing 3C. The set different from the set provided with the branch portion J1 is the lower stage side module portion 6A of the side module 6L on one side in the width direction Dw, the lower stage side module portion 6A of the side module 6R on the other side in the width direction Dw, and the upper stage side module portion 6B of the side module 6R on the other side in the width direction Dw.

The second flow rate regulation portion R2 is provided in each of the downstream side tubes 120C of the lower stage side module portion 6A of the side module 6L, the lower stage side module portion 6A of the side module 6R, and the upper stage side module portion 6B of the side module 6R. As a result, the second flow rate regulation portion R2 regulates the flow rate of the cooling medium in each of the downstream side tubes 120C of the lower stage side module portion 6A of the side module 6L, the lower stage side module portion 6A of the side module 6R, and the upper stage side module portion 6B of the side module 6R.

Figure 8:
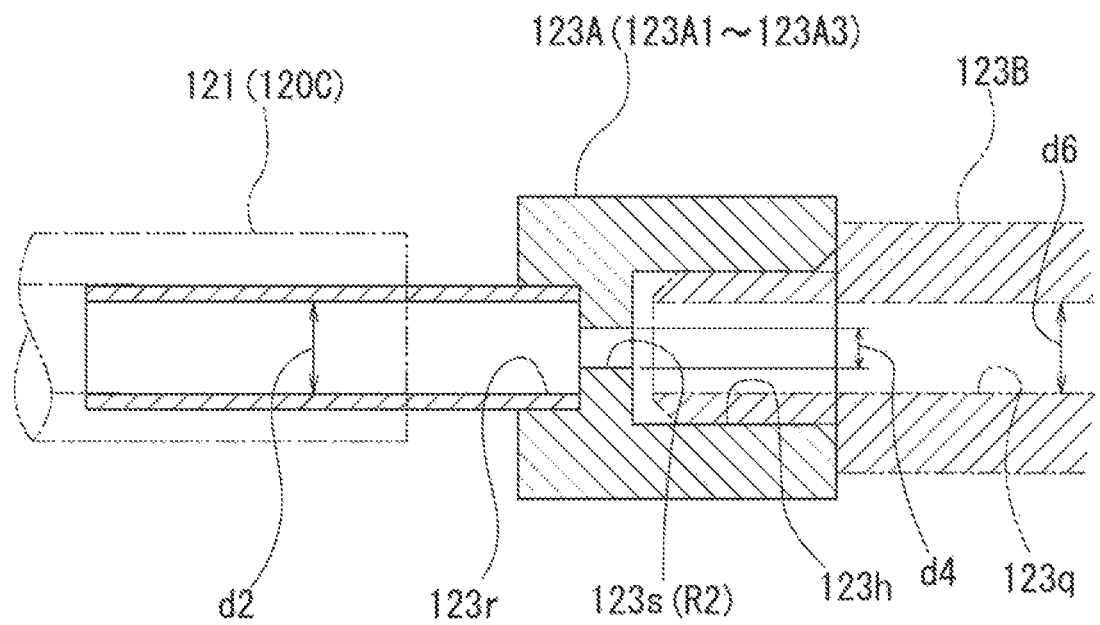
FIG. 8 is a cross-sectional view of a joint provided in the cooling system for the electronic device according to the third example embodiment of the present invention.

FIG. 8 is a cross-sectional view of a joint provided in the cooling system of the electronic device of the present example embodiment.

As shown in this figure, the second flow rate regulation portion R2 is formed in the joint 123A provided in each of the lower stage side module portion 6A of the side module 6L, the lower stage side module portion 6A of the side module 6R, and the upper stage side module portion 6B of the side module 6R. The second flow rate regulation portion R2 is a second throttle portion 123s formed in a joint flow path 123r in the joint 123A. The second throttle portion 123s is formed in an insertion hole portion 123h into which the joint 123B is to be inserted in the joint 123A. The inner diameter d4 of the second throttle portion 123s is smaller than the inner diameter d2 of the joint flow path 123r in the joint 123A of a portion to which the first downstream side tube 121 is connected, and the inner diameter d6 of a joint flow path 123q in the joint 123B to which the second downstream side tube 122 is to be connected. In addition, it is preferable that the inner diameter d4 of the second throttle portion 123s is larger than the inner diameter d1 of the first throttle portion 145s of the first flow rate regulation portion R1.

Here, the inner diameter d4 of the second throttle portion 123s may be different between the joint 123A provided in the lower stage side module portion 6A of the side module 6L, the joint 123A provided in the lower stage side module portion 6A of the side module 6R, and the joint 123A provided in the upper stage side module portion 6B of the side module 6R.

Figure 9:
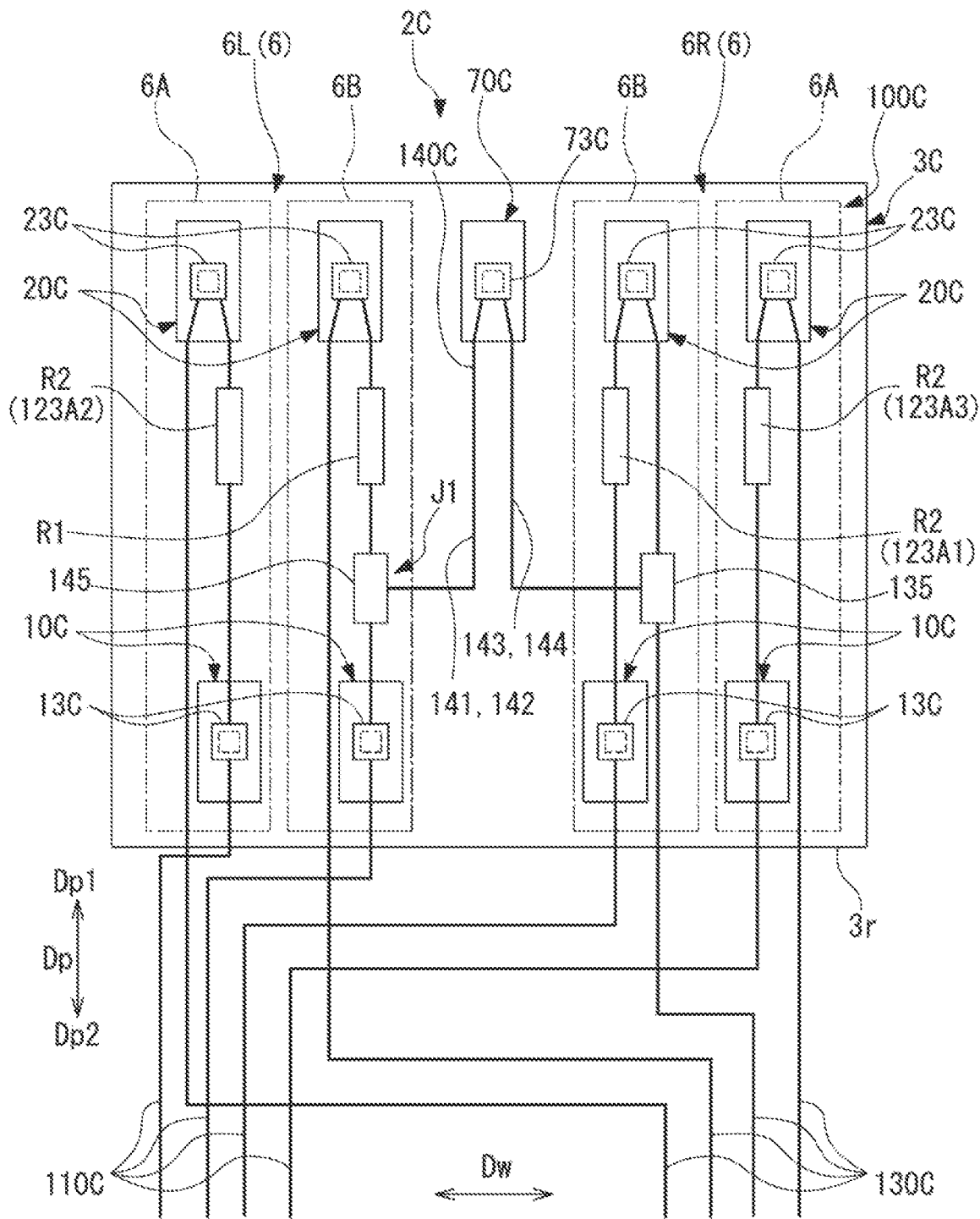
FIG. 9 is a block diagram showing a functional configuration of the cooling system for the electronic device according to the third example embodiment of the present invention.

FIG. 9 is a block diagram showing a functional configuration of the cooling system of the present example embodiment.

As shown in FIG. 9, for example, the cooling system 100C may discharge the cooling medium passed through the third module 70C through the discharge tube 130C of a set different from the set provided with the branch portion J1 among a plurality of sets of the first module 10C and the second module 20C.

As shown in FIG. 9, in the upper stage side module portion 6B of the side module 6L, the cooling medium passes through the first module 10C and is then distributed to the second module 20C and the third module 70C. The cooling medium passed through the third module 70C merges the discharge tubes 130C of the upper stage side module portion 6B of the side module 6R of a set different from the set of the upper stage side module portion 6B of the side module 6L. Therefore, the pressure loss differs between the second module 20C and the third module 70C. Accordingly, in the upper stage side module portion 6B of the side module 6L, the inner diameter d1 (refer to FIG. 7) of the first throttle portion 145s of the branch joint 145 constituting the first flow rate regulation portion R1 is set in accordance with the difference in pressure loss between the second module 20C and the third module 70C.

In addition, in the upper stage side module portion 6B of the side module 6R, as described above, the cooling medium passed through the third module 70C via the branch tube 140C merges the discharge tube 130C. Therefore, in the upper stage side module portion 6B of the side module 6R, the cooling medium flowing through the first module 10C and the second module 20C is affected by the cooling medium merging from the third module 70C to the discharge tube 130C. In the upper stage side module portion 6B of the side module 6R, the pressure difference between the upstream side and the downstream side of the first module 10C and the second module 20C is smaller than that when the cooling medium is not affected by the merging cooling medium. Therefore, in the joint 123A (joint 123A1 shown in FIG. 9) provided in the upper stage side module portion 6B of the side module 6R, the inner diameter d4 of the second throttle portion 123s is set in accordance with the pressure difference between the upstream side and the downstream side of the first module 10C and the second module 20C. Here, it is preferable that the inner diameter d4 of the second throttle portion 123s is set larger than the inner diameter d1 of the first throttle portion 145s of the upper stage side module portion 6B of the side module 6L.

In each of the lower stage side module portion 6A of the side module 6L and the lower stage side module portion 6A of the side module 6R, the cooling medium is supplied only to the first module 10C and the second module 20C. That is, the lower stage side module portion 6A of the side module 6L and the lower stage side module portion 6A of the side module 6R are not affected by the cooling medium merging from the modules of the other sets, unlike the upper stage side module portion 6B of the side module 6R.

Therefore, in the joint 123A (joint 123A2 shown in FIG. 9) provided in the lower stage side module portion 6A of the side module 6L and the joint 123A (joint 123A3 shown in FIG. 9) provided in the lower stage side module portion 6A of the side module 6R, it is preferable to set the inner diameter d4 of the second throttle portion 123s to be large.

For example, in the joint 123A2 and the joint 123A3, the inner diameter d4 of the second throttle portion 123s may be set to be larger than the inner diameter d1 of the first throttle portion 145s of the branch joint 145 and the inner diameter d4 of the second throttle portion 123s of the joint 123A1.

Here, the lower stage side module portion 6A of the side module 6L and the lower stage side module portion 6A of the side module 6R may be configured not to form the second throttle portion 123s. In this case, the inner diameter d1 of the first throttle portion 145s of the branch joint 145 and the inner diameter d4 of the second throttle portion 123s of the joint 123A1 are set on the basis of the flow rate of the cooling medium in the lower stage side module portion 6A of the side module 6L and the lower stage side module portion 6A of the side module 6R.

In the cooling system 100C, the first module 10C and the second module 20C are arranged in the housing 3C in series at different positions in the depth direction Dp of the housing 3C. In addition, the third module 70C is provided in the housing 3C at a different position in the width direction Dw with respect to the first module 10C and the second module 20C. The cooling system 100C is provided with the upstream side tube 110C that supplies the cooling medium to the first module 10C, the downstream side tube 120C that supplies the cooling medium passed through the first module 10C to the second module 20C, and the branch tube 140C that branches from the downstream side tube 120C and supplies the cooling medium to the third module 70C.

In such a configuration, the cooling medium can be supplied to the first module 10C, the second module 20C, and the third module 70C in the housing 3C through the upstream side tube 110C. Therefore, the number of tubes for transporting the cooling medium from the outside to the inside of the housing 3C can be reduced, the cost and the labor for assembling can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

In the cooling system 100C, the plurality of sets of the first module 10C and the second module 20C are provided in the housing 3C. The branch tubes 140C are provided so as to branch from the downstream side tubes 120C of the plurality of sets of the first module 10C and the second module 20C.

In such a configuration, the plurality of sets of the first module 10C and the second module 20C are provided in the housing 3C, but as for the upstream side tubes 110C, the upstream side tubes 110C need only to be provided in accordance with the number of sets of the first module 10C and the second module 20C. In other words, it is not necessary to provide upstream side tubes 110C in accordance with the total number of the modules in the housing 3C (total number of the first modules 10C, the second modules 20C, and the third modules 70C). Therefore, the number of tubes for transporting the cooling medium from the outside to the inside of the housing 3C can be effectively reduced.

In the cooling system 100C, the branch portion J1 where the branch tube 140C branches from the downstream side tube 120C is provided with the first flow rate regulation portion R1 for regulating the flow rate of the cooling medium in the downstream side tube 120C and the branch tube 140C.

In such a configuration, the cooling medium is distributed to the second module 20C and the third module 70C on the downstream side of the first module 10C. As a result, the flow rate of the cooling medium differs between the second module 20C and the third module 70C due to the difference in pressure loss. By regulating the flow rate of the cooling medium in the downstream side tube 120C and the branch tube 140C by the first flow rate regulation portion R1, the flow rate balance of the cooling medium supplied to the second module 20C and the third module 70C can be improved. Therefore, it is possible to equalize the cooling efficiency of the CPUs 12C, 22C, and 72C by the cooling members 13C, 23C, and 73C.

In the cooling system 100C, the flow rate of the cooling medium in the downstream side tube 120C and the branch tube 140C can be regulated with a simple configuration by providing the first throttle portion 145s in the branch joint 145 as the first flow rate regulation portion R1.

In the cooling system 100C, the flow rate of the cooling medium in the downstream side tube 120C is regulated by the second flow rate regulation portion R2 in a set different from the set in which the branch tube 140C branches from the downstream side tube 120C. As a result, the flow rate balance of the cooling medium can be improved between the set of the first module 10C and the second module 20C in which the branch portion J1 is not provided and the set of the first module 10C, the second module 20C, and the third module 70C in which the branch portion J1 is provided.

In the cooling system 100C, as the second flow rate regulation portion R2, the second throttle portion 123s is provided in the joint 123A connecting the first downstream side tube 121 and the second downstream side tube 122 that constitute the downstream side tube 120C. As a result, the flow rate of the cooling medium in the downstream side tube 120C can be regulated with a simple configuration.

In the cooling system 100C, the cooling medium passed through the third module 70C is discharged through the discharge tubes 130C of the set different from the set in which the branch tube 140C branches from the downstream side tube 120C among the plurality of sets of the first module 10C and the second module 20C.

When the cooling medium passed through the third module 70C is discharged through the discharge tube 130C of the set different from the set in which the branch tube 140C branches from the downstream side tube 120C, the flow rate of the cooling medium is more likely to differ between the second module 20C and the third module 70C. In such a configuration, by regulating the flow rate of the cooling medium by the first flow rate regulation portion R1 and/or the second flow rate regulation portion R2, the flow rate balance of the cooling medium supplied to the plurality of modules can be improved.

The server 2C is provided with the housing 3C and the above cooling system 100C.

In this configuration, it is possible to provide the server 2C provided with the cooling system 100C that can solve the problem that the number of tubes for transporting the cooling medium from the outside to the inside of the housing 3C increases, the cost and the labor for assembling are required, and it is difficult to secure the space for providing the tubes.

Fourth Example Embodiment

Figure 10:
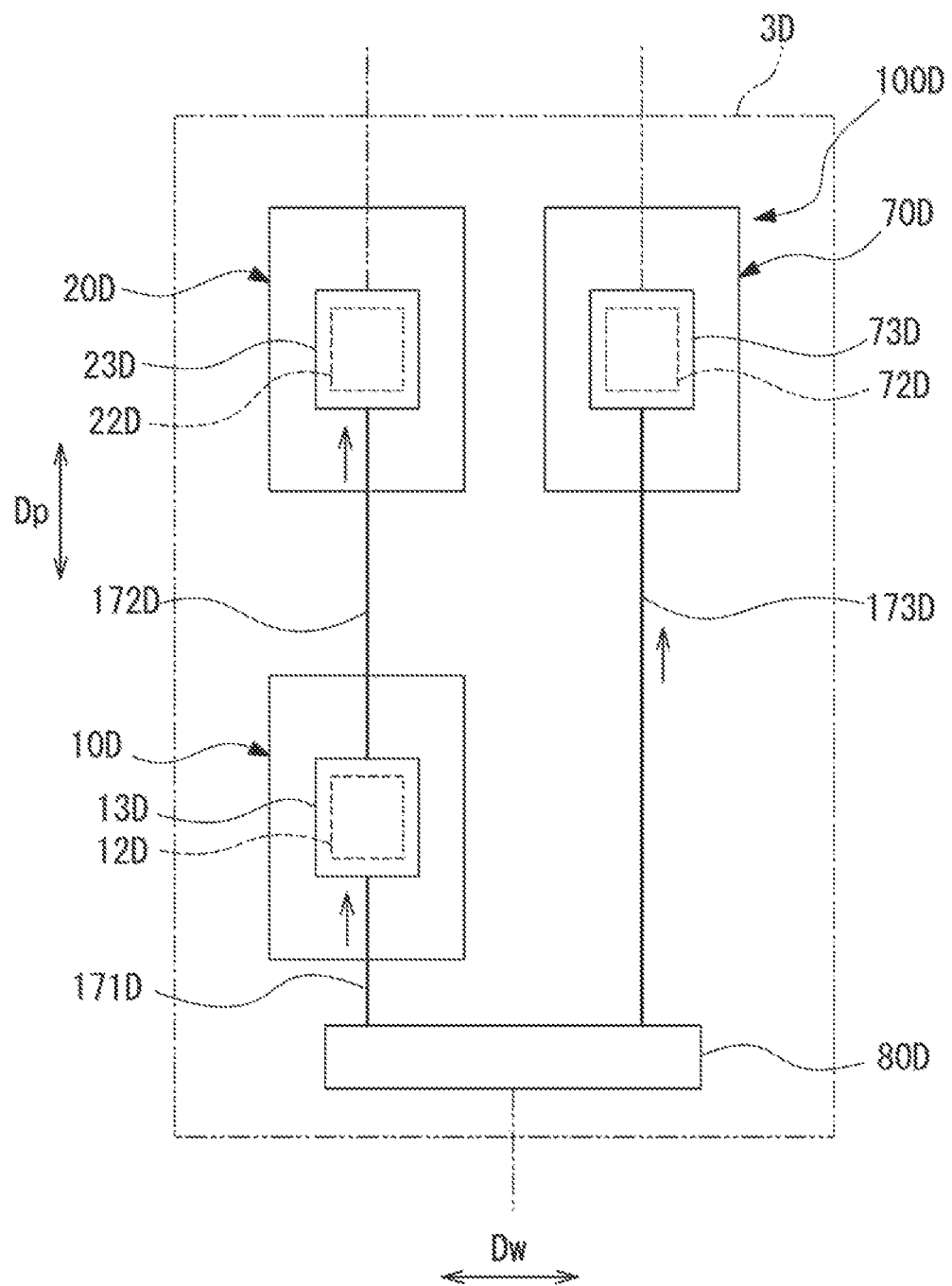
FIG. 10 is a diagram showing a minimum configuration of a cooling system according to a fourth example embodiment of the present invention.

FIG. 10 is a diagram showing a minimum configuration of a cooling system according to the present example embodiment.

As shown in this figure, a cooling system 100D needs only to be provided with at least a first module 10D, a second module 20D, a third module 70D, a header 80D, a first upstream side tube 171D, a first downstream side tube 172D, and a second upstream side tube 173D.

The first module 10D is provided in a housing 3D. The first module 10D is provided with a heat generating member 12D (first heat generating member) and a cooling member 13D for cooling the heat generating member 12D.

The second module 20D is provided in the housing 3D at a position different in the depth direction Dp of the housing 3D with respect to the first module 10D. The second module 20D is provided with a heat generating member 22D (second heat generating member) and a cooling member 23D for cooling the heat generating member 22D.

The third module 70D is provided in the housing 3D at a different position in the width direction Dw intersecting the depth direction Dp of the housing 3D with respect to the first module 10D and the second module 20D. The third module 70D is provided with a heat generating member 72D (third heat generating member) and a cooling member 73D for cooling the heat generating member 72D.

The header 80D is provided in the housing 3D. The cooling medium supplied from the outside is sent to the header 80D.

The first upstream side tube 171D is connected to the header 80D. The first upstream side tube 171D supplies the cooling medium from the header 80D to the cooling member 13D of the first module 10D.

The first downstream side tube 172D supplies the cooling medium passed through the cooling member 13D of the first module 10D to the cooling member 23D of the second module 20D.

The second upstream side tube 173D is connected to the header 80D. The second upstream side tube 173D supplies the cooling medium from the header 80D to the cooling member 73D of the third module 70D.

In such a configuration, the cooling medium supplied from the outside of the housing 3D is divided into the first upstream side tube 171D and the second upstream side tube 173D by the header 80D provided in the housing 3D. As a result, the cooling medium is distributed to the first module 10D, the second module 20D, and the third module 70D provided at a different position in the width direction Dw with respect to the first module 10D and the second module 20D.

By providing the header 80D in the housing 3D in this manner, the number of tubes for transporting the cooling medium from the outside to the inside of the housing 3D can be reduced. Therefore, the cost and the labor for assembling the tubes for transporting the cooling medium can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

Fifth Example Embodiment

Figure 11:
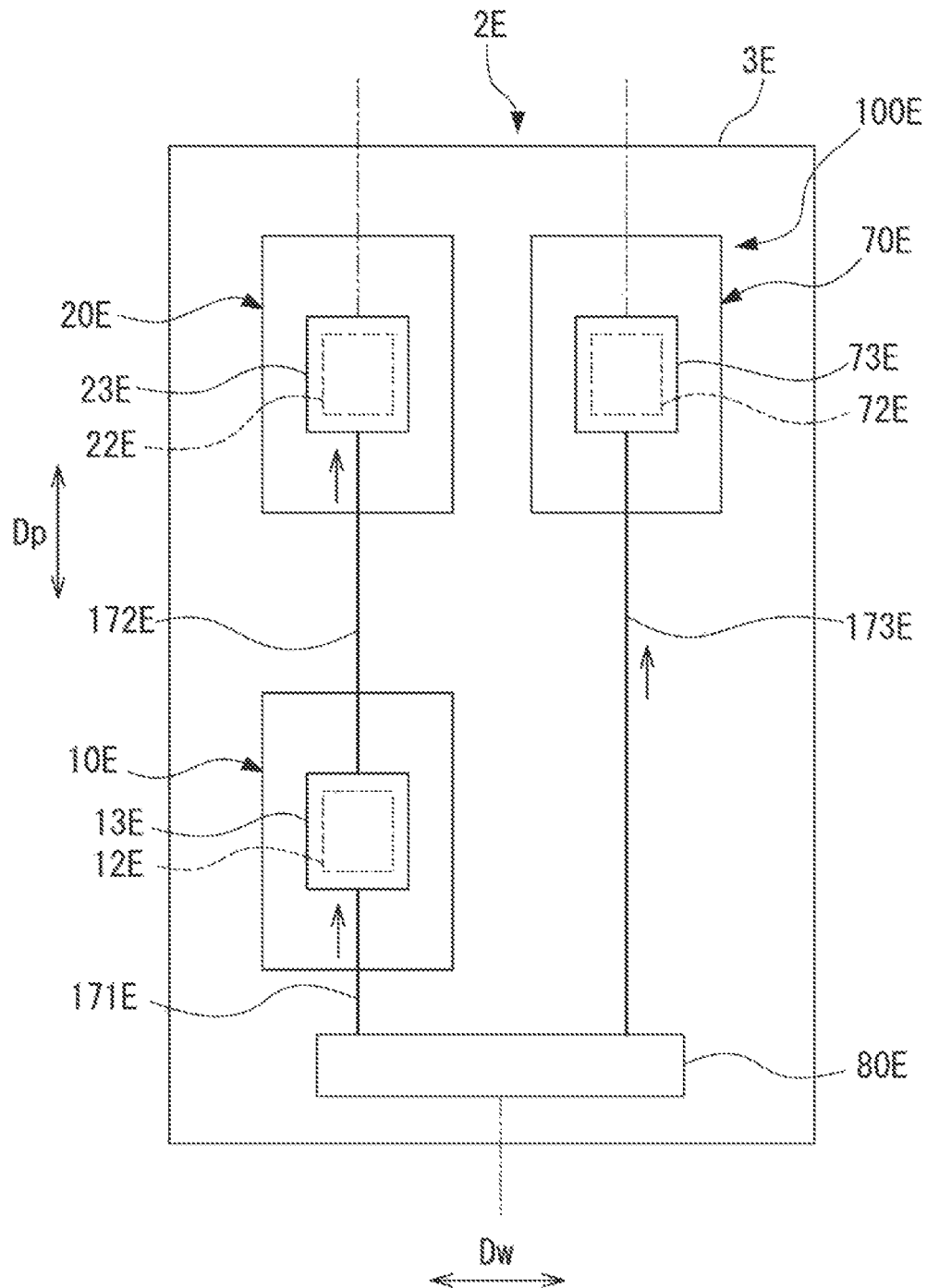
FIG. 11 is a diagram showing a minimum configuration of an electronic device according to a fifth example embodiment of the present invention.

FIG. 11 is a diagram showing a minimum configuration of an electronic device according to the present example embodiment.

As shown in this figure, an electronic device 2E needs only to be provided with at least a housing 3E and a cooling system 100E. The cooling system 100E is provided with a first module 10E, a second module 20E, a third module 70E, a header 80E, a first upstream side tube 171E, a first downstream side tube 172E, and a second upstream side tube 173E.

The first module 10E is provided in the housing 3E. The first module 10E is provided with a heat generating member 12E (first heat generating member) and a cooling member 13E for cooling the heat generating member 12E.

The second module 20E is provided in the housing 3E at a position different in the depth direction Dp of the housing 3E with respect to the first module 10E. The second module 20E is provided with a heat generating member 22E (second heat generating member) and a cooling member 23E for cooling the heat generating member 22E.

The third module 70E is provided in the housing 3E at a different position in the width direction Dw intersecting the depth direction Dp of the housing 3E with respect to the first module 10E and the second module 20E. The third module 70E is provided with a heat generating member 72E (third heat generating member) and a cooling member 73E for cooling the heat generating member 72E.

The header 80E is provided in the housing 3E. The cooling medium supplied from the outside is sent to the header 80E.

The first upstream side tube 171E is connected to the header 80E. The first upstream side tube 171E supplies the cooling medium from the header 80E to the cooling member 13E of the first module 10E.

The first downstream side tube 172E supplies the cooling medium passed through the cooling member 13E of the first module 10E to the cooling member 23E of the second module 20E.

The second upstream side tube 173E is connected to the header 80E. The second upstream side tube 173E supplies the cooling medium from the header 80E to the cooling member 73E of the third module 70E.

In the electronic device 2E having such a configuration, the cooling medium is divided into the first upstream side tube 171E and the second upstream side tube 173E by the header 80E. As a result, the cooling medium is distributed to the first module 10E, the second module 20E, and the third module 70E. By providing the header 80E in the housing 3E in this manner, the number of tubes for transporting the cooling medium from the outside to the inside of the housing 3E can be reduced. Therefore, the cost and the labor for assembling the tubes for transporting the cooling medium can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

Sixth Example Embodiment

Figure 12:
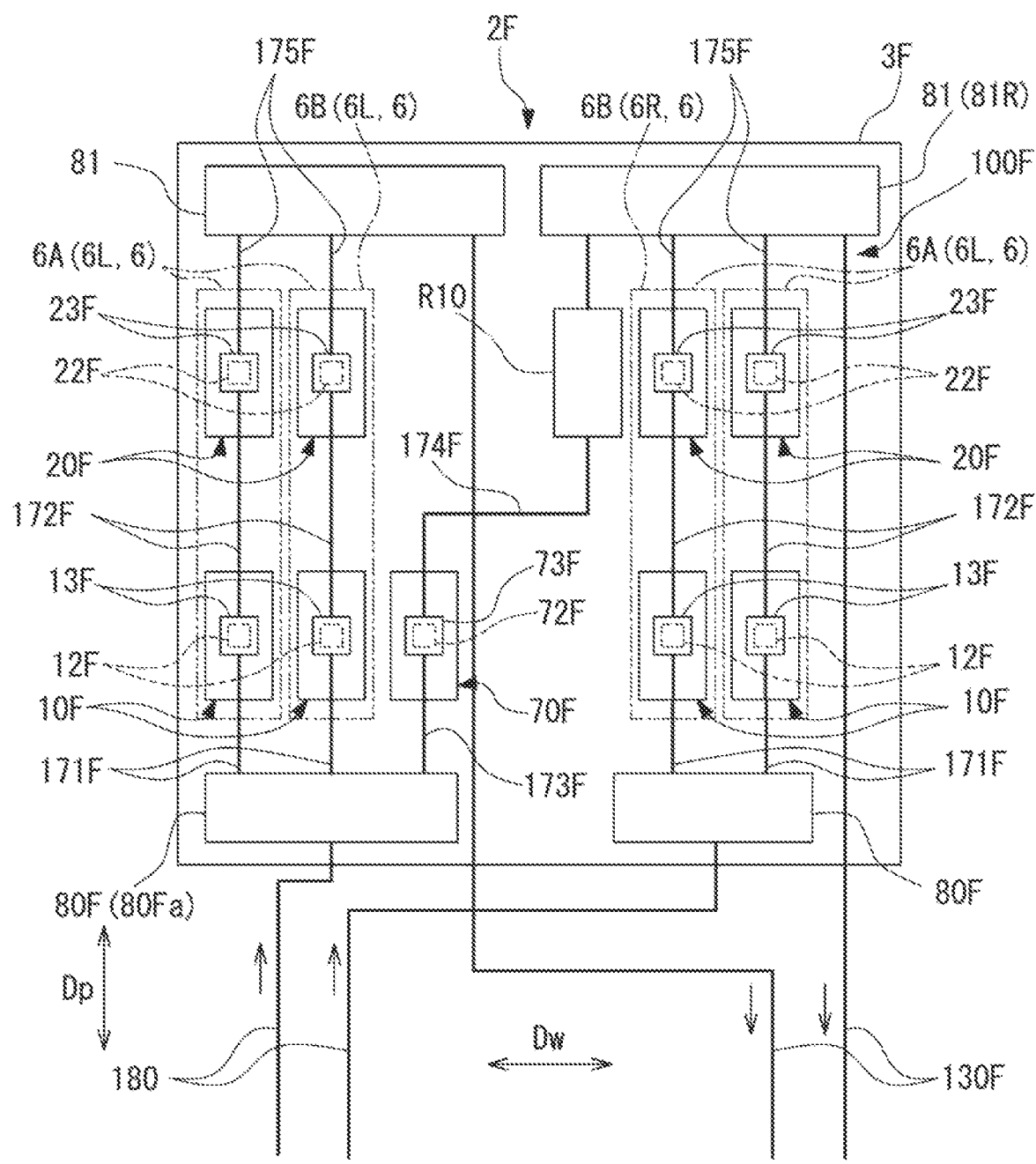
FIG. 12 is a block diagram showing a functional configuration of a cooling system for an electronic device according to a sixth example embodiment of the present invention.

FIG. 12 is a block diagram showing a functional configuration of a cooling system for an electronic device according to the present example embodiment.
(Overall Configuration of Server)

As shown in this figure, a server (electronic device) 2F is provided with a housing 3F and a cooling system 100F. Similarly to the server 2C of the third example embodiment, the server 2F is provided with side modules 6 and a third module 70F in the housing 3F.

(Side Module)

The side modules 6 are disposed on both sides in the width direction Dw in the housing 3F. In each side module 6, a lower stage side module portion 6A and an upper stage side module portion 6B are provided so as to be laminated in the vertical direction Dv. Each of the lower stage side module portion 6A and the upper stage side module portion 6B is provided with first modules 10F and second modules 20F.

In each of the lower stage side module portions 6A and the upper stage side module portions 6B, the first module 10F is provided with a substrate (not shown), a CPU (heat generating member) 12F (first heat generating member) mounted on the surface of the substrate, and a cooling member 13F laminated on the CPU 12F.

The second module 20F is provided in the housing 3F at a position different in the depth direction Dp of the housing 3F with respect to the first module 10F. The second module 20F has the same configuration as the first module 10F, and is provided with a substrate (not shown), a CPU (heat generating member) 22F (second heat generating member) mounted on the surface of the substrate, and a cooling member 23F laminated on the CPU 22F.

The cooling members 13F and 23F are made of a metal material and have, for example, a rectangular parallelepiped shape. A space (not shown) into which the cooling medium flows is formed inside the cooling members 13F and 23F.
(Third Module)

The third module 70F is provided in the housing 3F at a different position in the width direction Dw with respect to the first modules 10F and the second modules 20F. The third module 70F is provided with a substrate (not shown), a CPU (heat generating member) 72F (third heat generating member) mounted on the surface of the substrate, and a cooling member 73F laminated on the CPU 72F.

The cooling member 73F is made of a metal material and has, for example, a rectangular parallelepiped shape. A space (not shown) into which the cooling medium flows is formed inside the cooling member 73F.
(Cooling System)

The cooling system 100F cools the cooling members 13F of the first modules 10F, the cooling members 23F of the second modules 20F, and the cooling member 73F of the third module 70F with a cooling medium made of a liquid such as water. The cooling system 100F is mainly provided with the first modules 10F, the second modules 20F, the third module 70F, supply tubes 180, headers 80F, first upstream side tubes 171F, first downstream side tubes 172F, discharge side headers 81, discharge tubes 130F, and a second upstream side tube 173F.

The supply tubes 180 supply a cooling medium from the outside into the housing 3F. The supply tubes 180 are inserted from the outside to the inside of the housing 3F through tube insertion openings (not shown) formed in the housing 3F.

The headers 80F are provided in the housing 3F. The headers 80F are respectively provided on both sides in the width direction Dw in the housing 3F. The supply tubes 180 are connected to the respective headers 80F. The cooling medium supplied from the outside is sent to the headers 80F through the supply tubes 180.

The first upstream side tubes 171F supply the cooling medium from the headers 80F to the cooling members 13F of the first modules 10F. Two first upstream side tubes 171F are connected to the header 80F on each of both sides in the width direction Dw. One of the first upstream side tubes 171F connected to each header 80F is connected to the cooling member 13F of the first module 10F of the lower stage side module portion 6A of the side module 6. The other of the first upstream side tubes 171F connected to the header 80F is connected to the cooling member 13F of the first module 10F of the upper stage side module portion 6B of the side module 6.

The first downstream side tube 172F is connected to the cooling member 13F of the first module 10F and the cooling member 23F of the second module 20F in each of the lower stage side module portions 6A and the upper stage side module portions 6B. The first downstream side tube 172F supplies the cooling medium passed through the cooling member 13F of the first module 10F to the cooling member 23F of the second module 20F.

The discharge side headers 81 are provided in the housing 3F. The discharge side headers 81 are respectively provided on both sides in the width direction Dw in the housing 3F. Discharge side connection tubes 175F are connected between the discharge side header 81 and the cooling members 23F of the second modules 20F of the lower stage side module portions 6A and the upper stage side module portion 6B, on each of both sides in the width direction Dw in the housing 3F. The discharge side connection tubes 175F discharge the cooling medium passed through the cooling members 23F of the second modules 20F to the discharge side header 81.

The discharge tubes 130F discharge the cooling medium passed through the discharge side headers 81. The discharge tubes 130F are respectively provided for the discharge side headers 81 on both sides in the width direction Dw. The discharge tubes 130F are led out from the inside to the outside of the housing 3F through tube insertion openings (not shown) formed in the housing 3F.

The second upstream side tube 173F is connected to the header 80Fa on one side in the width direction Dw in the housing 3F. The second upstream side tube 173F supplies the cooling medium from a header 80Fa to the cooling member 73F of the third module 70F.

One end of a second downstream side tube 174F is connected to the cooling member 73F of the third module 70F. The other end of the second downstream side tube 174F is connected to a discharge side header 81R on the other side in the width direction Dw in the housing 3F. The second downstream side tube 174F sends the cooling medium passed through the cooling member 73F of the third module 70F to the discharge side header 81R on the downstream side.

The second downstream side tube 174F is provided with a flow rate regulation portion R10 for regulating the flow rate of the cooling medium supplied to the cooling member 73F of the third module 70F. Similarly to the second throttle portion 123s provided in the joint 123A of the third example embodiment, as the flow rate regulation portion R10, a throttle portion (not shown) having a narrow inner diameter may be provided in the flow path of the second downstream side tube 174F. In addition, a dummy cooling member (not shown) may be provided as the flow rate regulation portion R10. The dummy cooling member (not shown) is a cooling member in which a space (not shown) into which a cooling medium flows is formed, similarly to the cooling member 23F or the like, without cooling the heat generating member. By passing the cooling medium through the space of the dummy cooling member, a pressure loss equivalent to that of the cooling member 23F is imparted, and the flow rate is regulated.

Such a flow rate regulation portion R10 may be provided in the second upstream side tube 173F.

In such a configuration, in the cooling system 100F and the server 2F, the cooling medium is distributed to the first modules 10F, the second modules 20F, and the third module 70F by the headers 80F. By providing the headers 80F in the housing 3F in this manner, the number of supply tubes 180 (tubes) for transporting the cooling medium from the outside to the inside of the housing 3F can be reduced. Therefore, the cost and the labor for assembling the tubes for transporting the cooling medium can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

In addition, the cooling system 100F and the server 2F are provided with the discharge side headers 81. As a result, the number of discharge tubes 130F (tubes) for transporting the cooling medium from the inside to the outside of the housing 3F can be reduced. Therefore, the cost and the labor for assembling the tubes for transporting the cooling medium can be reduced, and the space for providing the tubes can be easily secured. As a result, it is possible to solve the problem that the number of tubes for transporting the cooling medium increases, the cost and the labor for assembling are required, and it is difficult to secure the space for providing the tubes.

In addition, the cooling system 100F is provided with the flow rate regulation portion R10 for regulating the flow rate of the cooling medium supplied to the cooling member 73F of the third module 70F.

In such a configuration, the flow rate regulation portion R10 regulates the flow rate of the cooling medium supplied to the cooling member 73F of the third module 70F, so that the flow rate balance of the cooling medium can be improved between the first modules 10F, the second modules 20F, and the third module 70F on the downstream side of the headers 80F.

Modification Examples of Example Embodiments

In the third example embodiment, the first flow rate regulation portion R1 and the second flow rate regulation portion R2 are provided, but these are not essential configurations. For example, it is possible to have a configuration without the second flow rate regulation portion R2. In addition, it is also possible to provide the second flow rate regulation portion R2 only in some of the sets in which the branch portion J1 is not provided.

In addition, in the third and sixth example embodiments, the first flow rate regulation portion R1, the second flow rate regulation portion R2, and the flow rate regulation portion R10 are used to equalize the flow rate balance of the cooling medium, but the regulation of the flow rate of the cooling medium is not limited thereto. For example, the flow rate of the cooling medium may be regulated in accordance with the difference in the amount of heat generated by the plurality of CPUs 12C, 22C, 72C, 12F, 22F, and 72F (heat generating members) provided in the servers 2C and 2F (electronic devices).

In addition, in the third and sixth example embodiments, the first modules 10C and 10F and the second modules 20C and 20F are provided on both sides of in the width direction Dw in the housing 3C and 3F, but the number and arrangement of these modules are not limited thereto. In the housing 3C, three or more sets of the first modules 10C and 10F and the second modules 20C and 20F in the width direction Dw may be provided in series in the depth direction Dp.

In addition, in the third and sixth example embodiments, the first modules 10C and 10F and the second modules 20C and 20F provided in series in the depth direction Dp are provided in two stages in the vertical direction Dv, but the number of stages of these modules is not limited thereto. The first modules 10C and 10F and the second modules 20C and 20F provided in series in the depth direction Dp may be provided in only one stage or in three or more stages in the vertical direction Dv.

In addition, in the third and sixth example embodiments, the first modules 10C and 10F and the second modules 20C and 20F are provided in series in the depth direction Dp, but three or more modules may be provided in series in the depth direction Dp.

In addition, in the third and sixth example embodiments, the electronic device is provided with only one third module 70C or 70F, but the number of installations, installation positions, and the like of the third module 70C or 70F can be appropriately changed within the scope of the gist of the present invention.

In addition, the applications, component configurations, number of equipment, and the like of the cooling systems 100A to 100F, the electronic devices 2B and 2E, and the servers 2C and 2F shown in the first to sixth example embodiments are not limited at all.

In addition to this, unless it deviates from the gist of the present invention, it is possible to select the configuration described in the above example embodiments and/or change it to another configuration as appropriate.

This application is based upon and claims the benefit of priority from Japanese Patent Application No. 2019-205338 filed on Nov. 13, 2019, the disclosure of which is incorporated herein in its entirety by reference.

INDUSTRIAL APPLICABILITY

The present invention can be applied to, for example, an electronic device provided with a cooling member for cooling a heat generating member. According to the present invention, the number of tubes can be reduced.

DESCRIPTION OF REFERENCE SIGNS 2B, 2E: Electronic device
2C, 2F: Server (electronic device)
3A to 3F: Housing
10A to 10F: First module
12A, 12B, 12D, 12E: Heat generating member
12C, 12F: CPU (heat generating member)
13A to 13F: Cooling member
20A to 20F: Second module
22A, 22B, 22D, 22E: Heat generating member
22C, 22F: CPU (heat generating member)
23A to 23F: Cooling member
70A to 70F: Third module
72A, 72B, 72D, 72E: Heat generating member
72C, 72F: CPU (heat generating member)
73A to 73F: Cooling member
80D, 80E, 80F, 80Fa: Header
100A to 100F: Cooling system
110A, 110B, 110C: Upstream side tube
120A, 120B, 120C: Downstream side tube
121: First downstream side tube
122: Second downstream side tube
123A, 123A1, 123A2, 123A3, 123B: Joint
130C, 130F: Discharge tube
140A, 140B, 140C: Branch tube
145: Branch joint
145r: Flow path
145s: First throttle portion
171D, 171E, 171F: First upstream side tube
172D, 172E, 172F: First downstream side tube
173D, 173E, 173F: Second upstream side tube
174F: Second downstream side tube
Dp: Depth direction
Dw: Width direction
J1: Branch portion
R1: First flow rate regulation portion
R2: Second flow rate regulation portion
R10: Flow rate regulation portion

The invention claimed is:

1. A cooling system comprising:
a first module provided in a housing and including a first heat generating member and a cooling member configured to cool the first heat generating member;
a second module provided in the housing at a different position in a depth direction of the housing with respect to the first module and including a second heat generating member and a cooling member configured to cool the second heat generating member;
a third module provided in the housing at a different position in a width direction intersecting the depth direction of the housing with respect to the first module and the second module and including a third heat generating member and a cooling member configured to cool the third heat generating member;
an upstream side tube configured to supply a cooling medium to the cooling member of the first module;
a downstream side tube configured to supply the cooling medium passed through the cooling member of the first module to the cooling member of the second module; and
a branch tube configured to branch from the downstream side tube between the first module and the second module and supply the cooling medium to the cooling member of the third module,
wherein a plurality of sets of the first module and the second module are provided in the housing,
wherein the branch tube is provided so as to branch from the downstream side tube of at least one set among the plurality of sets of the first module and the second module,
wherein each of the plurality of sets of the first module and the second module further comprises a discharge tube configured to discharge the cooling medium passed through the second module, and
wherein the cooling medium passed through the third module is discharged through the discharge tube of a set different from the set in which the branch tube branches from the downstream side tube among the plurality of sets of the first module and the second module.

2. The cooling system according to claim 1, further comprising a branch joint configured to connect the downstream side tube and the branch tube and a first flow rate regulation portion provided at the branch joint and configured to regulate a flow rate of the cooling medium in the downstream side tube and the branch tube.

3. The cooling system according to claim 2, wherein the first flow rate regulation portion is a first throttle portion formed in a flow path in the branch joint.

4. The cooling system according to claim 1, further comprising a flow rate regulation portion provided in the downstream side tube of a set different from the set in which the branch tube branches from the downstream side tube among the plurality of sets of the first module and the second module and configured to regulate a flow rate of the cooling medium in the downstream side tube.

5. The cooling system according to claim 4, wherein the downstream side tube included in the set different from the set in which the branch tube branches from the downstream side tube comprises:
- a first downstream side tube connected to the cooling member of the first module;
- a second downstream side tube connected to the cooling member of the second module; and
- a joint provided between the first downstream side tube and the second downstream side tube and to which the first downstream side tube and the second downstream side tube are detachably connected, and
- the second flow rate regulation portion is a second throttle portion formed in a flow path in the joint.

\* \* \* \* \*